US009508935B2

(12) United States Patent
Watanabe

(10) Patent No.: US 9,508,935 B2
(45) Date of Patent: Nov. 29, 2016

(54) FUNCTION LAYER INK, METHOD FOR MANUFACTURING LIGHT-EMITTING ELEMENT, LIGHT-EMITTING DEVICE, AND ELECTRONIC APPARATUS

(71) Applicant: SEIKO EPSON CORPORATION, Tokyo (JP)

(72) Inventor: Shotaro Watanabe, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 579 days.

(21) Appl. No.: 13/800,082

(22) Filed: Mar. 13, 2013

(65) Prior Publication Data

US 2013/0256636 A1  Oct. 3, 2013

(30) Foreign Application Priority Data

Apr. 2, 2012  (JP) ................. 2012-083623

(51) Int. Cl.
*H01L 51/50* (2006.01)
*H01L 51/54* (2006.01)
*H01L 51/56* (2006.01)
*H01L 51/00* (2006.01)
*C09D 11/36* (2014.01)

(52) U.S. Cl.
CPC ....... *H01L 51/0037* (2013.01); *H01L 51/0007* (2013.01); *C09D 11/36* (2013.01); *H01L 51/0005* (2013.01)

(58) Field of Classification Search
CPC .......... H01L 51/0005; H01L 51/0007; H01L 51/50; H01L 51/56; H01L 51/0036; H01L 51/0037; H01L 51/5012; C09D 11/36
See application file for complete search history.

(56) References Cited

U.S. PATENT DOCUMENTS

| | | | |
|---|---|---|---|
| 7,405,255 B2 * | 7/2008 | Spreitzer et al. | 524/474 |
| 7,807,070 B2 * | 10/2010 | Bright et al. | 252/301.16 |
| 7,871,543 B2 * | 1/2011 | Brabec et al. | 252/500 |
| 7,901,962 B1 * | 3/2011 | Jou et al. | 438/22 |
| 8,052,895 B2 * | 11/2011 | Wu et al. | 252/500 |
| 8,053,973 B2 * | 11/2011 | Nagayama et al. | 313/504 |
| 8,093,347 B2 * | 1/2012 | Heuft et al. | 528/211 |
| 8,187,669 B2 * | 5/2012 | Kanbe et al. | 427/64 |
| 8,308,979 B2 * | 11/2012 | Ishino et al. | 252/301.16 |
| 8,404,159 B2 * | 3/2013 | Goddard et al. | 252/500 |
| 8,431,040 B2 * | 4/2013 | Lyon et al. | 252/301.16 |

(Continued)

FOREIGN PATENT DOCUMENTS

| | | | | |
|---|---|---|---|---|
| GB | 2466842 | * | 7/2010 | H01L 51/56 |
| JP | A-2001-93668 | | 4/2001 | |

(Continued)

OTHER PUBLICATIONS

English translation of WO 2013/046264 from Google.*

Primary Examiner — Mary Wilczewski
(74) Attorney, Agent, or Firm — Oliff PLC

(57) ABSTRACT

A function layer ink used for forming a function layer by a liquid coating process contains a function layer material containing a macromolecular material or a low-molecular-weight material, and a mixed solvent containing solvent A and solvent B. Solvent A has a viscosity in the range of 0.01 to 0.05 Pa·s, and solvent B has a viscosity of less than 0.01 Pa·s and a lower boiling point than solvent A. The mixed solvent has a viscosity of less than 0.02 Pa·s and a boiling point in the range of 200 to 350° C., and contains 0.1% to 10% by weight of solvent A.

17 Claims, 19 Drawing Sheets

| | | MIXED SOLVENT (CONTAINING 0.1% TO 10% BY WEIGHT OF SOLVENT A) | | | | | | FILM CONDITION | LUMINESCENT CONDITION |
|---|---|---|---|---|---|---|---|---|---|
| | | A | | | B | | | | |
| | | CHEMICAL COMPOUND | Bp [°C] | Pa·s | CHEMICAL COMPOUND | Bp [°C] | Pa·s | | |
| EXAMPLES 1 AND 5 | | 1,1-BIS (3, 4-DIMETHYLPHENYL) ETHANE | 333 | 0.036 | (1) CYCLOHEXYLBENZENE | 238 | 0.004 | GOOD | GOOD |
| | | | | | (2) 3-PHENOXYTOLUENE | 268 | 0.006 | GOOD | GOOD |
| | | | | | (3) 3-ISOPROPYLBIPHENYL | 296 | 0.009 | GOOD | GOOD |
| | | | | | (4) DIMETHYLNAPHTHALENE | 268 | 0.006 | GOOD | GOOD |
| | | | | | (5) 1, 2, 3, 4-TETRAMETHYLBENZENE | 205 | 0.002 | GOOD | GOOD |
| | | | | | (6) DIETHYLENE GLYCOL BUTYLMETHYL ETHER | 212 | 0.002 | GOOD | GOOD |
| | | | | | (7) DIETHYLENE GLYCOL DIBUTYL ETHER | 256 | 0.003 | GOOD | GOOD |
| | | | | | (8) DIETHYLENE GLYCOL MONOBUTYL ETHER ACETATE | 247 | 0.003 | GOOD | GOOD |
| | | ETHYLENE GLYCOL MONOPHENYL ETHER | 283 | 0.025 | (1) CYCLOHEXYLBENZENE | 238 | 0.004 | GOOD | GOOD |
| | | | | | (2) 3-PHENOXYTOLUENE | 268 | 0.006 | FAIR | FAIR |
| | | | | | (3) 3-ISOPROPYLBIPHENYL | 296 | 0.009 | BAD | BAD |
| | | | | | (4) DIMETHYLNAPHTHALENE | 268 | 0.006 | GOOD | GOOD |
| | | | | | (5) 1, 2, 3, 4-TETRAMETHYLBENZENE | 205 | 0.002 | GOOD | GOOD |
| | | | | | (6) DIETHYLENE GLYCOL BUTYLMETHYL ETHER | 212 | 0.002 | GOOD | GOOD |
| | | | | | (7) DIETHYLENE GLYCOL DIBUTYL ETHER | 256 | 0.003 | GOOD | GOOD |
| | | | | | (8) DIETHYLENE GLYCOL MONOBUTYL ETHER ACETATE | 247 | 0.003 | GOOD | GOOD |

(56) References Cited

U.S. PATENT DOCUMENTS

| | | | |
|---|---|---|---|
| 8,822,986 B2* | 9/2014 | Kawanami et al. | 257/40 |
| 9,023,239 B2* | 5/2015 | Kawanami | C09D 11/02 |
| | | | 252/301.16 |
| 2004/0248338 A1* | 12/2004 | Sirringhaus et al. | 438/99 |
| 2005/0067949 A1* | 3/2005 | Natarajan et al. | 313/504 |
| 2008/0124570 A1 | 5/2008 | Kondo et al. | |
| 2008/0206447 A1* | 8/2008 | Inoue et al. | 427/64 |
| 2008/0254320 A1 | 10/2008 | Akino et al. | |
| 2009/0074974 A1* | 3/2009 | Yokoi et al. | 427/335 |
| 2009/0096355 A1 | 4/2009 | Ohuchi et al. | |
| 2009/0130296 A1* | 5/2009 | Kwong et al. | 427/64 |
| 2009/0297695 A1* | 12/2009 | Mitsuya et al. | 427/66 |
| 2010/0243960 A1* | 9/2010 | Matsue et al. | 252/301.35 |
| 2010/0287764 A1* | 11/2010 | McGregor et al. | 29/623.5 |
| 2011/0114927 A1 | 5/2011 | Obana et al. | |
| 2011/0177304 A1* | 7/2011 | Rokuhara | 428/195.1 |
| 2011/0220886 A1* | 9/2011 | Takeshima et al. | 257/40 |
| 2011/0226992 A1* | 9/2011 | Takeshima et al. | 252/301.16 |
| 2012/0001124 A1* | 1/2012 | Ishino et al. | 252/301.16 |
| 2012/0295381 A1 | 11/2012 | Obana et al. | |
| 2013/0082249 A1* | 4/2013 | Kawanami et al. | 257/40 |
| 2013/0139720 A1* | 6/2013 | Kawanami et al. | 106/31.13 |
| 2014/0079874 A1* | 3/2014 | Agari et al. | 427/66 |
| 2014/0106492 A1* | 4/2014 | Chung et al. | 438/46 |
| 2014/0138655 A1* | 5/2014 | Sonoyama et al. | 257/40 |
| 2014/0230900 A1* | 8/2014 | Cull et al. | 136/263 |

FOREIGN PATENT DOCUMENTS

| | | | | |
|---|---|---|---|---|
| JP | A-2006-190759 | 7/2006 | | |
| JP | A-2007-16227 | 1/2007 | | |
| JP | A-2007-106990 | 4/2007 | | |
| JP | A-2008-77958 | 4/2008 | | |
| JP | A-2010-123930 | 6/2010 | | |
| JP | A-2011/108462 | 6/2011 | | |
| WO | WO 2007/099808 A1 | 9/2007 | | |
| WO | WO 2009/064026 A1 * | 5/2009 | | C09D 201/00 |
| WO | WO 2013/046264 * | 4/2013 | | H01L 51/50 |

* cited by examiner

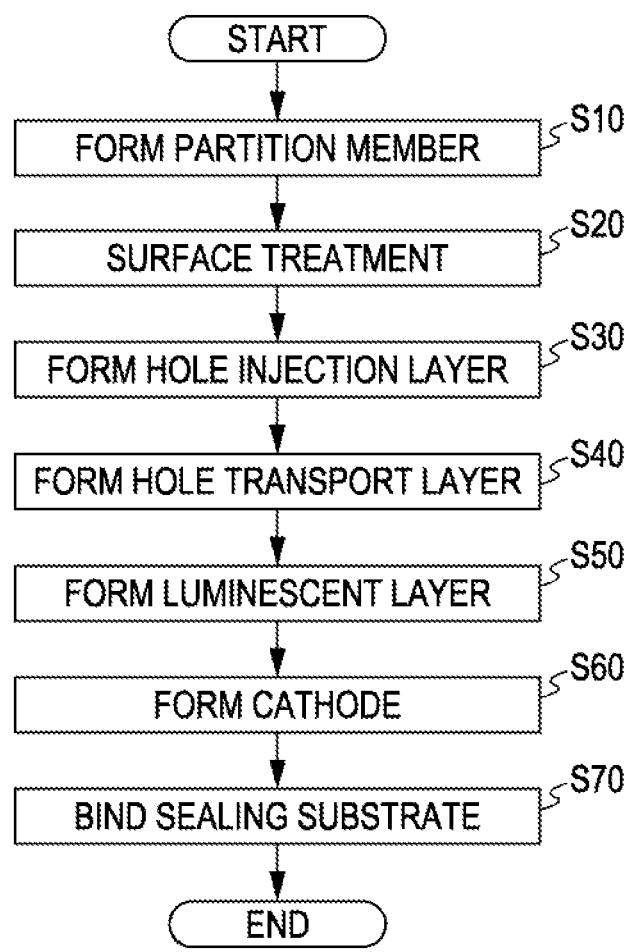

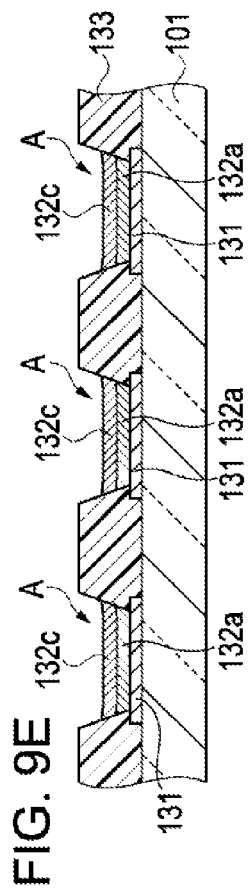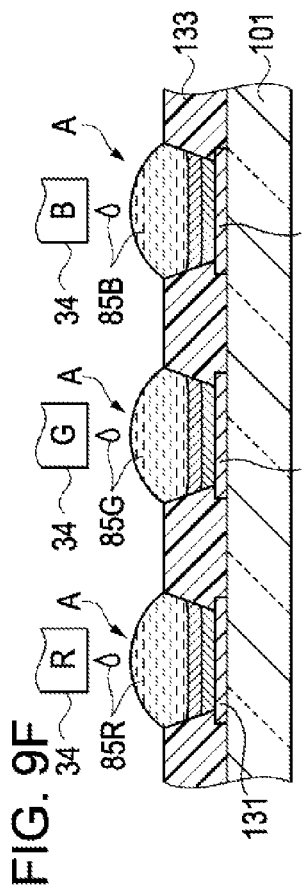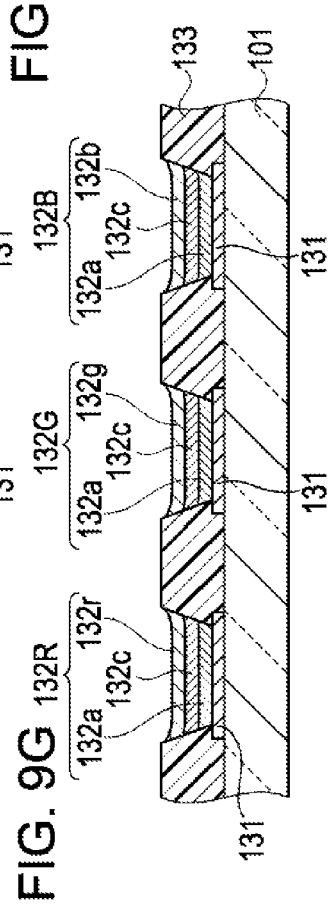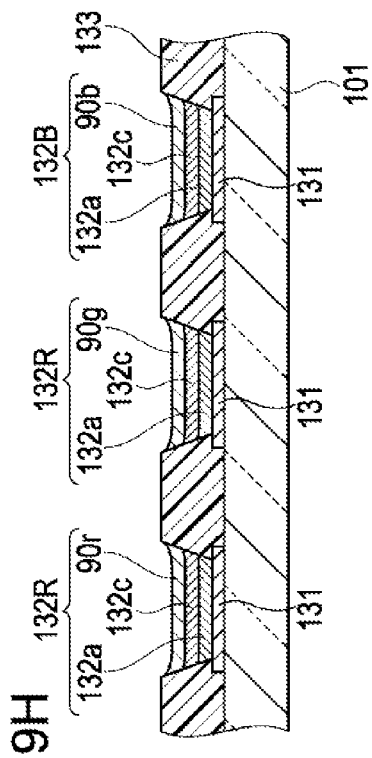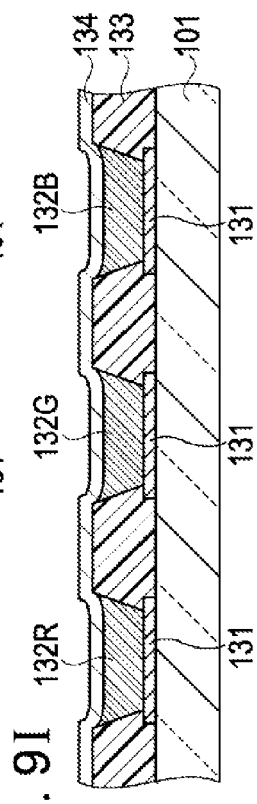

FIG. 10A

| | MIXED SOLVENT (CONTAINING 0.1% TO 10% BY WEIGHT OF SOLVENT A) | | | | | | FILM CONDITION | LUMINESCENT CONDITION |
|---|---|---|---|---|---|---|---|---|
| | A | | | B | | | | |
| | CHEMICAL COMPOUND | Bp [°C] | Pa·s | CHEMICAL COMPOUND | Bp [°C] | Pa·s | | |
| EXAMPLES 1 AND 5 | 1,1-BIS(3,4-DIMETHYLPHENYL) ETHANE | 333 | 0.036 | (1) CYCLOHEXYLBENZENE | 238 | 0.004 | GOOD | GOOD |
| | | | | (2) 3-PHENOXYTOLUENE | 268 | 0.006 | GOOD | GOOD |
| | | | | (3) 3-ISOPROPYLBIPHENYL | 296 | 0.009 | GOOD | GOOD |
| | | | | (4) DIMETHYLNAPHTHALENE | 268 | 0.006 | GOOD | GOOD |
| | | | | (5) 1,2,3,4-TETRAMETHYLBENZENE | 205 | 0.002 | GOOD | GOOD |
| | | | | (6) DIETHYLENE GLYCOL BUTYLMETHYL ETHER | 212 | 0.002 | GOOD | GOOD |
| | | | | (7) DIETHYLENE GLYCOL DIBUTYL ETHER | 256 | 0.003 | GOOD | GOOD |
| | | | | (8) DIETHYLENE GLYCOL MONOBUTYL ETHER ACETATE | 247 | 0.003 | GOOD | GOOD |
| | ETHYLENE GLYCOL MONOPHENYL ETHER | 283 | 0.025 | (1) CYCLOHEXYLBENZENE | 238 | 0.004 | GOOD | GOOD |
| | | | | (2) 3-PHENOXYTOLUENE | 268 | 0.006 | FAIR | FAIR |
| | | | | (3) 3-ISOPROPYLBIPHENYL | 296 | 0.009 | BAD | BAD |
| | | | | (4) DIMETHYLNAPHTHALENE | 268 | 0.006 | GOOD | GOOD |
| | | | | (5) 1,2,3,4-TETRAMETHYLBENZENE | 205 | 0.002 | GOOD | GOOD |
| | | | | (6) DIETHYLENE GLYCOL BUTYLMETHYL ETHER | 212 | 0.002 | GOOD | GOOD |
| | | | | (7) DIETHYLENE GLYCOL DIBUTYL ETHER | 256 | 0.003 | GOOD | GOOD |
| | | | | (8) DIETHYLENE GLYCOL MONOBUTYL ETHER ACETATE | 247 | 0.003 | GOOD | GOOD |

FIG. 10B

| | MIXED SOLVENT (CONTAINING 0.1% TO 10% BY WEIGHT OF SOLVENT A) | | | | | | | |
|---|---|---|---|---|---|---|---|---|
| | A | | | B | | | FILM CONDITION | LUMINESCENT CONDITION |
| | CHEMICAL COMPOUND | Bp [°C] | Pa·s | CHEMICAL COMPOUND | Bp [°C] | Pa·s | | |
| EXAMPLES 1 AND 5 | TRIBUTYRIN | 305 | 0.018 | (1) CYCLOHEXYLBENZENE | 238 | 0.004 | GOOD | GOOD |
| | | | | (2) 3-PHENOXYTOLUENE | 268 | 0.006 | GOOD | GOOD |
| | | | | (3) 3-ISOPROPYLBIPHENYL | 296 | 0.009 | GOOD | GOOD |
| | | | | (4) DIMETHYLNAPHTHALENE | 268 | 0.006 | GOOD | GOOD |
| | | | | (5) 1,2,3,4-TETRAMETHYLBENZENE | 205 | 0.002 | GOOD | GOOD |
| | | | | (6) DIETHYLENE GLYCOL BUTYLMETHYL ETHER | 212 | 0.002 | GOOD | GOOD |
| | | | | (7) DIETHYLENE GLYCOL DIBUTYL ETHER | 256 | 0.003 | GOOD | GOOD |
| | | | | (8) DIETHYLENE GLYCOL MONOBUTYL ETHER ACETATE | 247 | 0.003 | GOOD | GOOD |

FIG. 10C

| MIXED SOLVENT (CONTAINING 0.1% TO 10% BY WEIGHT OF SOLVENT A) | | | | | | | |
|---|---|---|---|---|---|---|---|
| A | | | B | | | FILM CONDITION | LUMINESCENT CONDITION |
| CHEMICAL COMPOUND | Bp [°C] | Pa·s | CHEMICAL COMPOUND | Bp [°C] | Pa·s | | |
| EXAMPLES 2 AND 6 — TETRAETHYLENE GLYCOL MONOBUTYL ETHER | 304 | 0.014 | (1) DIETHYLENE GLYCOL MONOETHYL ETHER | 202 | 0.004 | GOOD | GOOD |
| | | | (2) DIETHYLENE GLYCOL MONOISOPROPYL ETHER | 207 | 0.004 | GOOD | GOOD |
| | | | (3) DIETHYLENE GLYCOL MONOISOBUTYL ETHER | 220 | 0.005 | GOOD | GOOD |
| | | | (4) DIETHYLENE GLYCOL MONOBUTYL ETHER | 231 | 0.005 | GOOD | GOOD |
| | | | (5) TRIPROPYLENE GLYCOL MONOMETHYL ETHER | 243 | 0.006 | GOOD | GOOD |
| | | | (6) TRIETHYLENE GLYCOL MONOMETHYL ETHER | 249 | 0.008 | GOOD | GOOD |
| | | | (7) TRIETHYLENE GLYCOL MONOBUTYL ETHER | 271 | 0.008 | GOOD | GOOD |
| | | | (8) TRIETHYLENE GLYCOL DIMETHYL ETHER | 216 | 0.002 | GOOD | GOOD |
| | | | (9) TRIETHYLENE GLYCOL BUTYLMETHYL ETHER | 261 | 0.003 | GOOD | GOOD |
| | | | (10) TETRAETHYLENE GLYCOL DIMETHYL ETHER | 275 | 0.003 | GOOD | GOOD |

FIG. 11A

| | MIXED SOLVENT (CONTAINING 0.1% TO 10% BY WEIGHT OF SOLVENT A) | | | | | | FILM CONDITION | LUMINESCENT CONDITION |
|---|---|---|---|---|---|---|---|---|
| | A | | | B | | | | |
| | CHEMICAL COMPOUND | Bp [°C] | Pa·s | CHEMICAL COMPOUND | Bp [°C] | Pa·s | | |
| EXAMPLES 3 AND 7 | 1,1-BIS(3,4-DIMETHYLPHENYL) ETHANE | 333 | 0.036 | (1) DIETHYLENE GLYCOL MONOETHYL ETHER | 202 | 0.004 | GOOD | GOOD |
| | | | | (2) DIETHYLENE GLYCOL MONOISOPROPYL ETHER | 207 | 0.004 | GOOD | GOOD |
| | | | | (3) DIETHYLENE GLYCOL MONOISOBUTYL ETHER | 220 | 0.005 | GOOD | GOOD |
| | | | | (4) DIETHYLENE GLYCOL MONOBUTYL ETHER | 231 | 0.005 | GOOD | GOOD |
| | | | | (5) TRIPROPYLENE GLYCOL MONOMETHYL ETHER | 243 | 0.005 | GOOD | GOOD |
| | | | | (6) TRIETHYLENE GLYCOL MONOMETHYL ETHER | 249 | 0.008 | GOOD | GOOD |
| | | | | (7) TRIETHYLENE GLYCOL MONOBUTYL ETHER | 271 | 0.008 | GOOD | GOOD |
| | | | | (8) TRIETHYLENE GLYCOL DIMETHYL ETHER | 216 | 0.002 | GOOD | GOOD |
| | | | | (9) TRIETHYLENE GLYCOL BUTYLMETHYL ETHER | 261 | 0.003 | GOOD | GOOD |
| | | | | (10) TETRAETHYLENE GLYCOL DIMETHYL ETHER | 275 | 0.003 | GOOD | GOOD |
| | ETHYLENE GLYCOL MONOPHENYL ETHER | 283 | 0.025 | (1) DIETHYLENE GLYCOL MONOETHYL ETHER | 202 | 0.004 | GOOD | GOOD |
| | | | | (2) DIETHYLENE GLYCOL MONOISOPROPYL ETHER | 207 | 0.004 | GOOD | GOOD |
| | | | | (3) DIETHYLENE GLYCOL MONOISOBUTYL ETHER | 220 | 0.005 | GOOD | GOOD |
| | | | | (4) DIETHYLENE GLYCOL MONOBUTYL ETHER | 231 | 0.005 | GOOD | GOOD |
| | | | | (5) TRIPROPYLENE GLYCOL MONOMETHYL ETHER | 243 | 0.005 | GOOD | GOOD |
| | | | | (6) TRIETHYLENE GLYCOL MONOMETHYL ETHER | 249 | 0.008 | GOOD | GOOD |
| | | | | (7) TRIETHYLENE GLYCOL MONOBUTYL ETHER | 271 | 0.008 | GOOD | GOOD |
| | | | | (8) TRIETHYLENE GLYCOL DIMETHYL ETHER | 216 | 0.002 | GOOD | GOOD |
| | | | | (9) TRIETHYLENE GLYCOL BUTYLMETHYL ETHER | 261 | 0.003 | GOOD | GOOD |
| | | | | (10) TETRAETHYLENE GLYCOL DIMETHYL ETHER | 275 | 0.003 | GOOD | GOOD |

FIG. 11B

| MIXED SOLVENT (CONTAINING 0.1% TO 10% BY WEIGHT OF SOLVENT A) | | | | | | | |
|---|---|---|---|---|---|---|---|
| A | | | | B | | | |
| CHEMICAL COMPOUND | Bp [°C] | Pa·s | | CHEMICAL COMPOUND | Bp [°C] | Pa·s | FILM CONDITION | LUMINESCENT CONDITION |

| | | | | | | | | |
|---|---|---|---|---|---|---|---|---|
| EXAMPLES 4 AND 8 | TETRAETHYLENE GLYCOL MONOBUTYL ETHER | 304 | 0.014 | (1) CYCLOHEXYLBENZENE | 238 | 0.004 | GOOD | GOOD |
| | | | | (2) 3-PHENOXYTOLUENE | 268 | 0.006 | GOOD | GOOD |
| | | | | (3) 3-ISOPROPYLBIPHENYL | 296 | 0.009 | GOOD | GOOD |
| | | | | (4) DIMETHYLNAPHTHALENE | 268 | 0.006 | GOOD | GOOD |
| | | | | (5) 1,2,3,4-TETRAMETHYLBENZENE | 205 | 0.002 | GOOD | GOOD |
| | | | | (6) DIETHYLENE GLYCOL BUTYLMETHYL ETHER | 212 | 0.002 | GOOD | GOOD |
| | | | | (7) DIETHYLENE GLYCOL DIBUTYL ETHER | 256 | 0.003 | GOOD | GOOD |
| | | | | (8) DIETHYLENE GLYCOL MONOBUTYL ETHER ACETATE | 247 | 0.003 | GOOD | GOOD |

FIG. 12A

| NON-AQUEOUS SOLVENT | | | | FILM CONDITION | LUMINESCENT CONDITION |
|---|---|---|---|---|---|
| B | | | | | |
| CHEMICAL COMPOUND | | Bp [°C] | Pa·s | | |
| COMPARATIVE EXAMPLES 1 AND 3 | (1) CYCLOHEXYLBENZENE | 238 | 0.004 | BAD | BAD |
| | (2) 3-PHENOXYTOLUENE | 268 | 0.006 | BAD | BAD |
| | (3) 3-ISOPROPYLBIPHENYL | 296 | 0.009 | BAD | BAD |
| | (4) DIMETHYL NAPHTHALENE | 268 | 0.006 | BAD | BAD |
| | (5) 1,2,3,4-TETRAMETHYL BENZENE | 205 | 0.002 | BAD | BAD |
| | (6) DIETHYLENE GLYCOL BUTYL METHYL ETHER | 212 | 0.002 | BAD | BAD |
| | (7) DIETHYLENE GLYCOL DIBUTYL ETHER | 256 | 0.003 | BAD | BAD |
| | (8) DIETHYLENE GLYCOL MONOBUTYL ETHER ACETATE | 247 | 0.003 | BAD | BAD |

FIG. 12B

| | AQUEOUS SOLVENT | | | FILM CONDITION | LUMINESCENT CONDITION |
|---|---|---|---|---|---|
| | B | | | | |
| | CHEMICAL COMPOUND | Bp [°C] | Pa·s | | |
| COMPARATIVE EXAMPLES 2 AND 4 | (1) DIETHYLENE GLYCOL MONOETHYL ETHER | 202 | 0.004 | BAD | BAD |
| | (2) DIETHYLENE GLYCOL MONOISOPROPYL ETHER | 207 | 0.004 | BAD | BAD |
| | (3) DIETHYLENE GLYCOL MONOISOBUTYL ETHER | 220 | 0.005 | BAD | BAD |
| | (4) DIETHYLENE GLYCOL MONOBUTYL ETHER | 231 | 0.005 | BAD | BAD |
| | (5) TRIPROPYLENE GLYCOL MONOMETHYL ETHER | 243 | 0.008 | BAD | BAD |
| | (6) TRIETHYLENE GLYCOL MONOMETHYL ETHER | 249 | 0.008 | BAD | BAD |
| | (7) TRIETHYLENE GLYCOL MONOBUTYL ETHER | 271 | 0.002 | BAD | BAD |
| | (8) TRIETHYLENE GLYCOL DIMETHYL ETHER | 216 | 0.003 | BAD | BAD |
| | (9) TRIETHYLENE GLYCOL BUTYLMETHYL ETHER | 261 | 0.003 | BAD | BAD |
| | (10) TETRAETHYLENE GLYCOL DIMETHYL ETHER | 275 | 0.003 | BAD | BAD |

FIG. 12C

| | NON-AQUEOUS SOLVENT | | | FILM CONDITION | LUMINESCENT CONDITION |
|---|---|---|---|---|---|
| | A | | | | |
| | CHEMICAL COMPOUND | Bp [°C] | Pa·s | | |
| COMPARATIVE EXAMPLES 5 AND 7 | 1,1-BIS (3, 4-DIMETHYL PHENYL) ETHANE | 333 | 0.036 | BAD | BAD |
| | ETHYLENE GLYCOL MONOPHENYL ETHER | 283 | 0.025 | BAD | BAD |
| | TRIBUTYNE | 305 | 0.018 | BAD | BAD |

FIG. 12D

| | AQUEOUS SOLVENT | | | FILM CONDITION | LUMINESCENT CONDITION |
|---|---|---|---|---|---|
| | A | | | | |
| | CHEMICAL COMPOUND | Bp [°C] | Pa·s | | |
| COMPARATIVE EXAMPLES 6 AND 8 | TETRAETHYLENE GLYCOL MONOBUTYL ETHER | 304 | 0.014 | BAD | BAD |

FUNCTION LAYER INK, METHOD FOR MANUFACTURING LIGHT-EMITTING ELEMENT, LIGHT-EMITTING DEVICE, AND ELECTRONIC APPARATUS

BACKGROUND

1. Technical Field

The present invention relates to a function layer ink used for forming a function layer, a method for manufacturing a light-emitting element, and a light-emitting device and an electronic apparatus.

2. Related Art

An organic electroluminescent element (light-emitting element) has a structure including at least one light-emitting organic layer (luminescent layer) between an anode and a cathode. In light-emitting elements of this type, electrons and holes are injected to the luminescent layer respectively from the cathode and the anode by applying an electric field between the cathode and the anode, and the electrons and the holes form excitons in the luminescent layer. When the excitons disappear (when electrons and holes are recombined with each other), part of the energy is emitted as fluorescence or phosphorescence.

In general, a light-emitting element has a hole injection layer on the anode, and a hole transport layer or a luminescent layer is disposed on the hole injection layer.

These layers may be formed by applying an ink in which the material of the layer to be formed is dissolved or dispersed, as described in, for example, JP-A-2008-77958.

In these years, low-molecular-weight luminescent materials, as well as macromolecular luminescent materials, are used as luminescent materials in coating processes such as liquid election methods, as disclosed in, for example, JP-A-2006-190759 and JP-A-2011-108462.

In JP-A-2006-190759 and JP-A-2011-108462, however, low-molecular-weight luminescent materials are liable to aggregate due to the intermolecular interaction of the material in the process of forming the luminescent layer. This makes it difficult to form a luminescent layer having a uniform thickness. In addition, the aggregation of the material may result in failure in forming the luminescent layer and cause emission failure. In other words, it is difficult to form a luminescent layer having desired optical properties with a high yield.

SUMMARY

The invention has been made to solve at least part of the above issues, and the following embodiments, or applications, of the invention can be provided.

Application 1

According to an aspect of the invention, a function. layer ink used for forming a function layer by a liquid coating process provided. The function layer ink contains a function layer material containing a macromolecular material or a low-molecular-weight material, and a mixed solvent containing solvent A in an amount of 0.1% to 10% by weight and solvent B. Solvent A has a viscosity in the range of 0.01 to 0.05 Pa·s, and solvent B has a viscosity of less than 0.01 Pa·s and a lower boiling point than solvent A. The mixed solvent has a viscosity of less than 0.02 Pa·s and a boiling point in the range of 200 to 350° C.

In this embodiment, solvent B evaporates more rapidly than solvent A when the function layer ink is dried. Accordingly, the viscosity of the mixed solvent gradually increases to the viscosity of solvent A. After solvent B has been evaporated, solvent A is mainly evaporated, and thus the drying speed of the ink is reduced. In this drying mechanism, the viscosity of the ink is increased and the drying speed is reduced. Consequently, aggregation caused by intermolecular interaction of the function layer material becomes slow, and is thus reduced. Thus, the function layer formed of the function layer ink can have a uniform. thickness after being dried.

Application 2

Solvent A and solvent B may be non-aqueous solvents.

Application 3

Solvent A and solvent B may be aqueous solvents.

Application 4

Solvent A may be a non-aqueous solvent while solvent B is an aqueous solvent.

Application 5

Solvent A may be an aqueous solvent while solvent B is a non-aqueous solvent.

If at least either solvent A or solvent B is aqueous, the surface tension of the function layer ink can be reduced in comparison with a case where a non-aqueous solvent is used. Consequently, the wettability (filling property) of the function layer ink can be increased in deposition regions where the function layer will be formed.

Application 6

According to another aspect of the invention, method is provided for manufacturing a light-emitting element having a function layer including one or more organic layers including an organic luminescent layer. In the method, at least one of the organic layers is formed of the function layer ink.

In this method, since the organic layer formed of the function layer ink can have a uniform thickness after being dried, a light-emitting element having desired optical properties can be manufactured with a high yield.

Application 7

In the method, the function layer may include a hole injection layer, a hole transport layer and the organic luminescent layer, and the hole injection layer is formed of the function layer ink.

Application 8

In the method, the function layer may include a hole injection layer, a hole transport layer and the organic luminescent layer, and the hole transport layer is formed of the function layer ink.

Application 9

In the method, the function layer may include a hole injection layer, a hole transport layer, and the organic luminescent layer, and the organic luminescent layer is formed of the function layer ink.

Application 10

According to still another aspect of the invention, a light-emitting device is provided which includes a light-emitting element manufactured by the above method. The light-emitting device can have desired optical properties.

Application 11

According to still another aspect of the invention, an electronic apparatus including the above light-emitting device is provided. The electronic apparatus can be an information apparatus exhibiting high display quality or an illuminating apparatus exhibiting reduced unevenness in brightness and making a good show.

BRIEF DESCRIPTION OF THE DRAWINGS

The invention will be described with reference to the accompanying drawings, wherein like numbers reference like elements.

FIG. 7 is a flow diagram of a method for manufacturing a light-emitting element according to an embodiment of the invention.

FIGS. 9E to 9I are schematic sectional views illustrating a method for manufacturing an organic EL element according to an embodiment of the invention.

FIGS. 10A to 10C are tables showing the evaluation results of Examples 1 2, 5 and 6.

FIGS. 11A and 11B are tables showing the evaluation results of Examples 3, 4, 7 and 8.

FIGS. 12A to 12D are tables showing the evaluation results of Comparative Examples 1 to 8.

DESCRIPTION OF EXEMPLARY EMBODIMENTS

Figure 1:
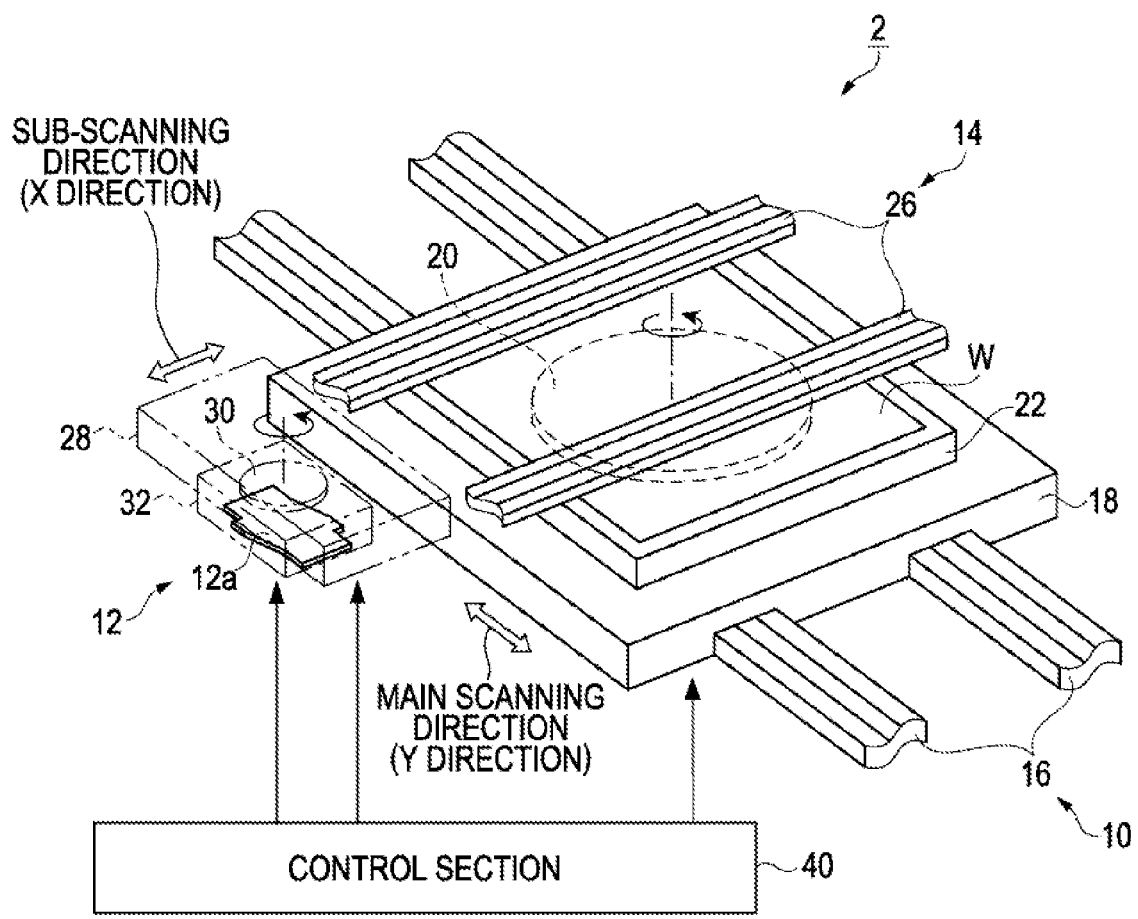
FIG. 1 is a schematic perspective view of an election apparatus according to an embodiment of the invention.

Some embodiments of the invention will be described with reference to the drawings. For ease of recognition, the dimensional proportions of the members or components in the drawings are changed as needed.
First Embodiment
Droplet Ejection Apparatus An ejection apparatus that can eject droplets of a liquid containing a function layer material onto an ejection target will first be described with reference to FIGS. 1 to 4.

FIG. 1 is a schematic perspective view of an election apparatus according to an embodiment. As shown in FIG. 1, the election apparatus 2 of the embodiment includes a work transport mechanism 10 that transports a planar work W, which is an ejection target, in a first direction, or a main scanning direction (Y direction), of the work W, and a head transport mechanism 14 that transports a head unit 12 in a second direction, or a sub scanning direction (X direction), perpendicular to the main scanning direction.

The work transport mechanism 10 includes a pair of guide rails 16, a movable platen 18 that moves along the pair of guide rails 16, and a stage 22 disposed on the movable platen 18. A work W is placed on the stage with a rotation mechanism 20 therebetween.

The movable platen 18 is moved in a main scanning direction (Y direction) by an air slider and a linear motor (not shown) that are disposed within the guide rails 16. The movable platen 18 is provided with an encoder 24 (see FIG. 4) that generates timing signals.

The encoder 24 reads graduations of a linear scale (not shown) disposed along the guide rails 16 while the movable platen 18 moves relatively in the main scanning direction (Y direction), thus generates encoder pulses as a timing signal. The encoder 24 may be disposed in other portions. For example, in an embodiment in which the movable platen 18 is disposed so as to move relatively in a main scanning direction (Y direction) along the rotational axis, a driving section may be provided for rotating the rotational axis, and the encoder 24 may be disposed at the driving section. The driving section may be a servomotor.

The stage 22 can secure the work W by suction, and the rotation mechanism 20 can precisely aligns the reference axes in the work W in the main scanning direction (Y direction) and the sub scanning direction (X direction).

In addition, the stage 22 can rotate the work W by, for example, 90 degrees according to how droplets of the liquid are deposited in the deposition region on the work W.

The head transport mechanism 14 includes a pair of guide rails 26 and a movable platen 28 that moves along the pair of guide rails 26. The movable platen 28 is provided with a carriage 32 suspended therefrom with a rotation mechanism 30 therebetween.

A head unit 12 in which a plurality of ejection heads 34 (see FIG. 2) are mounted is loaded in the carriage 32.

Figure 4:
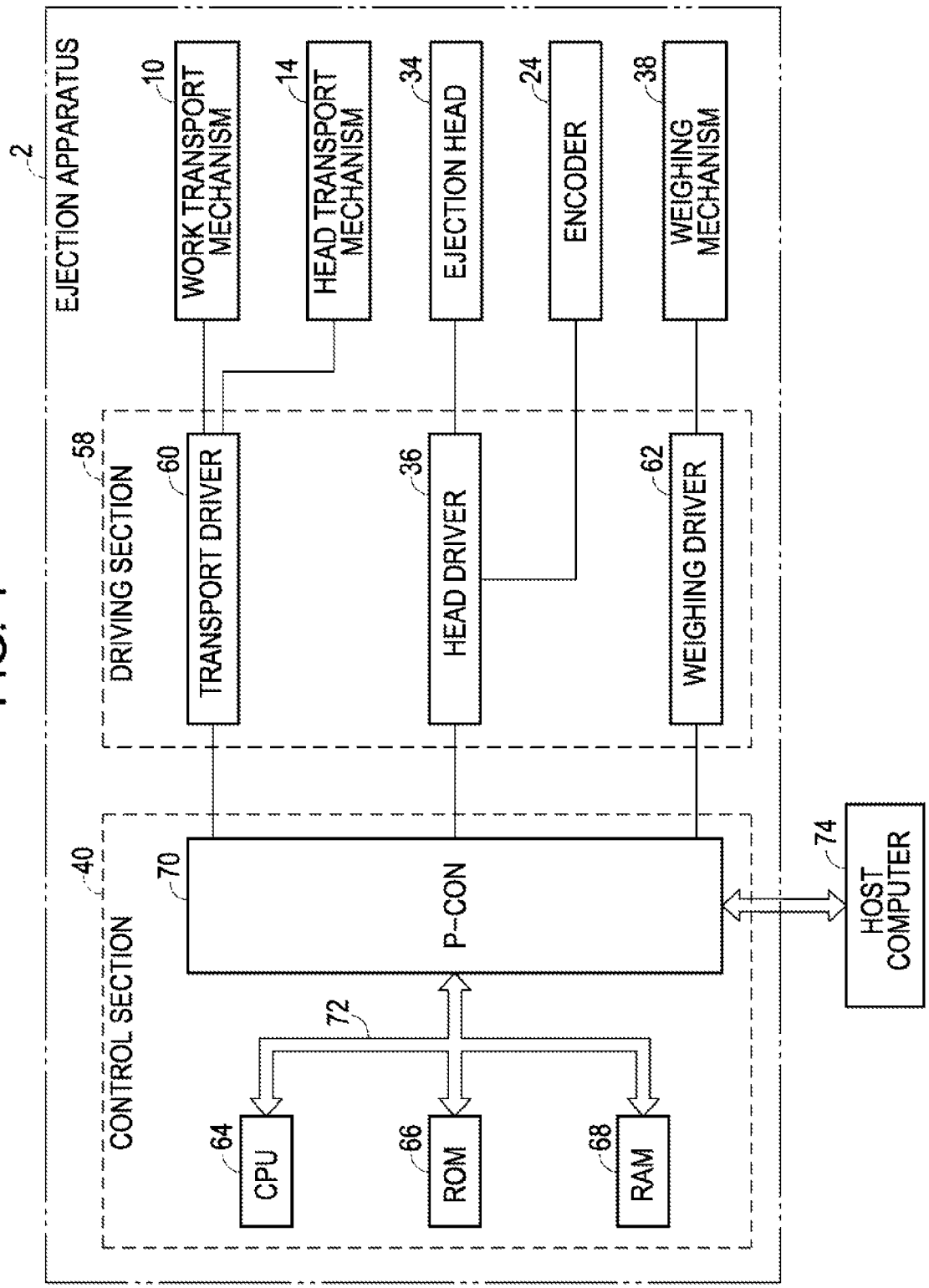
FIG. 4 is a block diagram of a control system of an election apparatus according to an embodiment of the invention.

The ejection apparatus 2 further includes a liquid feed mechanism (not shown) that feeds a liquid to the ejection heads 34 and a head driver 36 see FIG. 4) that electrically controls the operation of the ejection heads 34.

The movable platen 28 transports the carriage 32 in a sub scanning direction (X direction) so that the head unit 12 can oppose the work W.

The ejection apparatus 2 further includes a maintenance mechanism at a position facing the ejection heads 34. The maintenance mechanism eliminates nozzle clogging and removes foreign matter or dart from the nozzle face.

Also, each ejection head 34 has a weighing mechanism 38 (see FIG. 4), such as an electronic balance. The weighing mechanism 38 receives the liquid ejected from the ejection head 34 and measures the weight of the liquid. Furthermore, a control section 40 is provided for controlling the components of the ejection apparatus 2 as whole. The maintenance mechanism and the weighing mechanism 38 are not shown in FIG. 1.

Figure 2A:
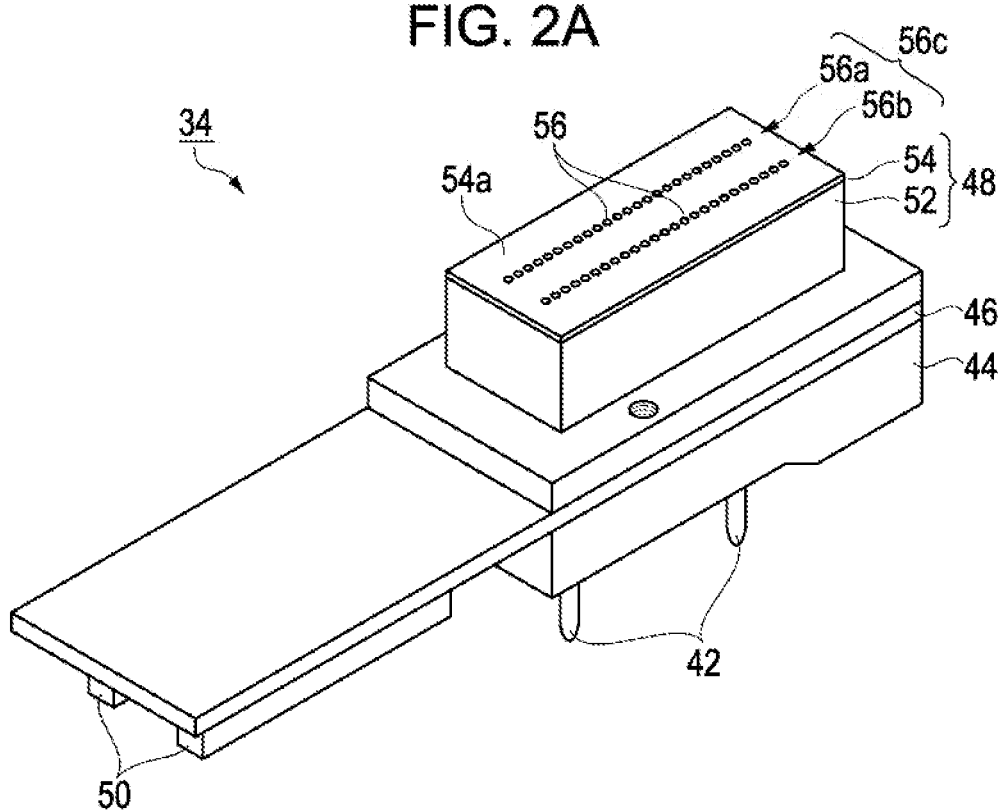
FIGS. 2A and 2B are schematic views of an ejection head according to an embodiment of the invention.
Figure 2B:
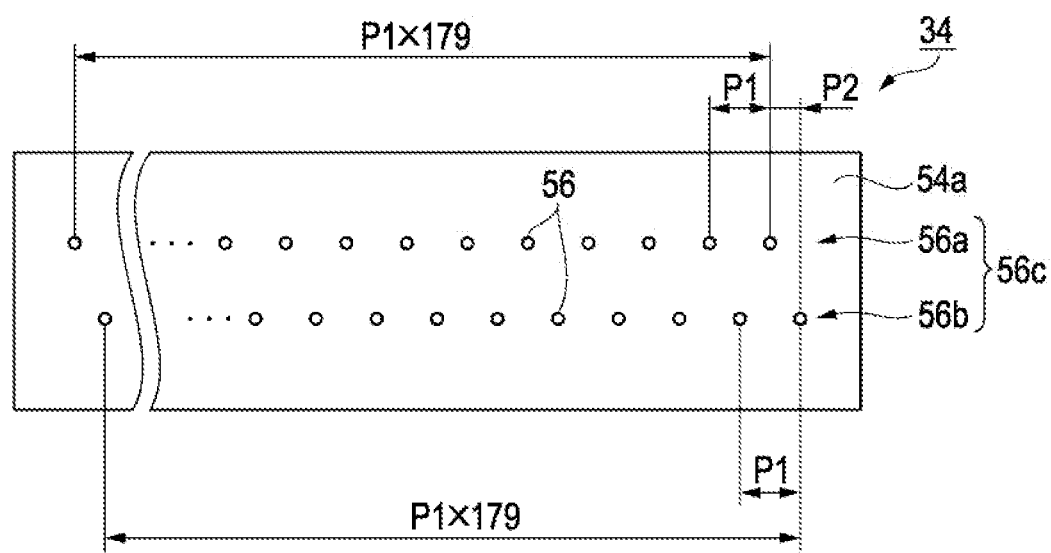

FIGS. 2A and 2B schematically show the structure of the election head 34. FIG. 2A is a perspective view of the election head 34, and FIG. 2B is a plan view showing the arrangement of the nozzles of the election head 34.

The election head 34, which is of two-line type as shown in FIG. 2A, includes a liquid entrance 44 having connection needles 42 for the two lines, a head substrate 46 disposed on the liquid entrance 44, and a head body 48 disposed on the head substrate 46 and provided with a liquid channel therein. The connection needles 42 are connected to the liquid feed mechanism (not shown) by piping so as to feed a liquid to the liquid channel in the head. The head substrate 46 is provided with connectors 50 in two lines. The connectors 50 are connected to the head driver 36 (see FIG. 4) through a flexible flat cable (not shown).

The head body 48 includes a pressurizing portion 52 including piezoelectric elements that act as driving portions and having cavities, and a nozzle plate 54 having a nozzle face 54*a* in which two nozzle lines 56*a* and 56*b* are arranged in parallel.

Each of the two nozzle lines 56*a* and 56*b* is provided with a plurality (180) of nozzles 56 arranged at regular intervals of a pitch P1 in such a manner that the intervals of pitch P1 are staggered at a pitch P2 (a half of pitch P1) between the two nozzle lines 56*a* and 55*b,* as shown in FIG. 2B. In the present embodiment, pitch P1 is about 141 μm. Hence, 360 nozzles 56 are arranged at a pitch of 70.5 μm when viewed in is direction perpendicular to a nozzle band 56*c* including the nozzle lines 56*a* and 56*b.* Each nozzle 56 has a diameter of about 27 μm.

In the ejection head 34, when an electrical driving signal is applied to the piezoelectric element from the head driver 36, the volume of the cavities in the pressurizing portion 52 is varied to produce a pumping action. The pumping action pressurizes the liquid in the cavities and thus ejects the liquid in the form of droplets through the nozzles 56.

The driving portion of the ejection head 34 is not limited to the piezoelectric element. As an alternative to the piezoelectric element, an electromechanical conversion element or an electrothermal conversion element may be used. The electromechanical conversion element displaces a vibration plate acting as an actuator by electrostatic adsorption. The electrothermal conversion element heats the liquid so as to be ejected in the form of droplets through the nozzles 56.

Figure 3:
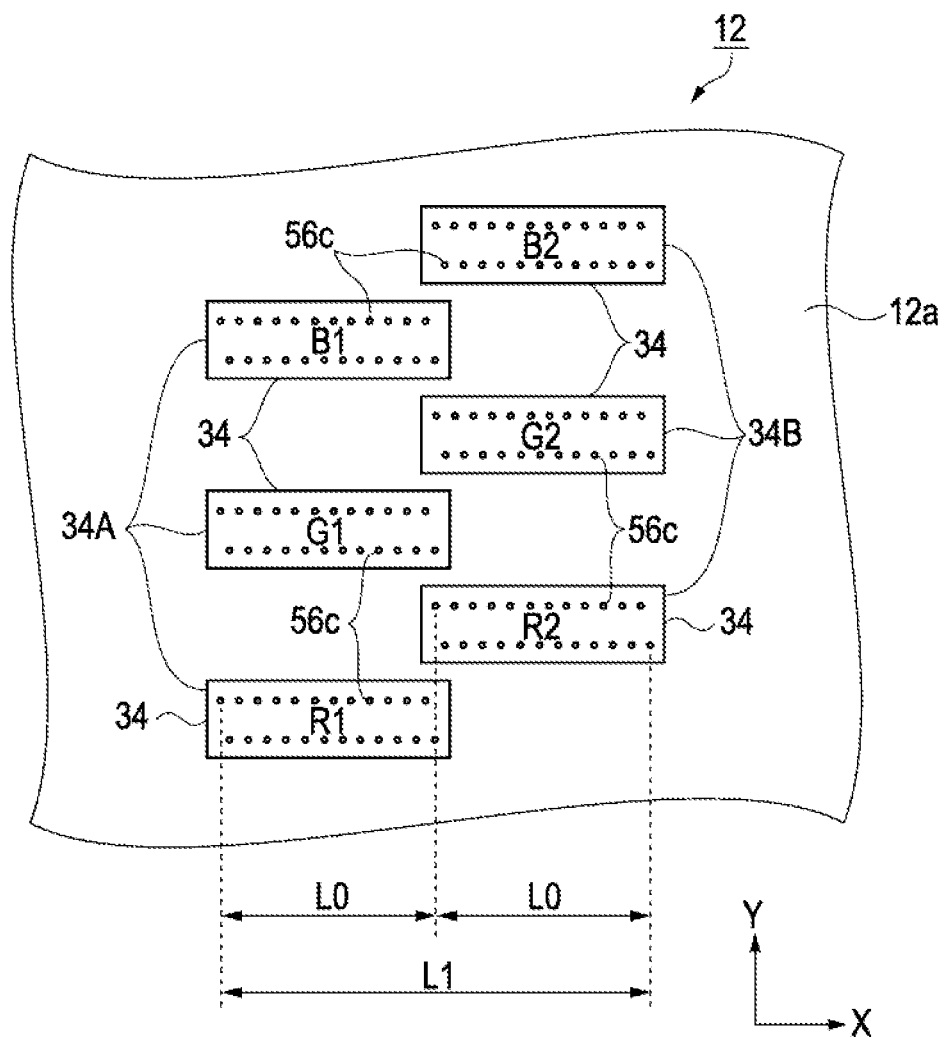
FIG. 3 is a schematic plan view of an arrangement of ejection heads in a head unit according to an embodiment of the invention.

FIG. 3 is a plan view of an arrangement of the ejection heads 34 in the head unit 12. FIG. 3 shows the arrangement at the side opposing the work W.

In the present embodiment, the head unit 12 includes a head plate 12*a* on which the election heads 34 are arranged, as shown in FIG. 3. Six ejection heads 34, including three election heads 34A and three election heads 34B, are mounted on the head plate 12*a*. In this instance, head R1 of the ejection heads 34A and head R2 of the election heads 34B eject the same liquid. The same applies to heads G1 and G2 and heads B1 and B2. The head unit 12 thus ejects three different liquids.

Each ejection head 34 has an image-forming width L0 within which the ejection head 34 can form an image. The image-forming width L0 is defined by the effective length of the nozzle band 56*c*. In the present embodiment described hereinafter, the nozzle band 56 refers to a band including 360 nozzles 56.

In this instance, head R1 and head R2 are arranged in parallel in the main scanning direction so that the adjacent nozzle lines between the two nozzle bands 56*c* are continuous with a pitch P1 in the sub scanning direction (X direction) when viewed from the main scanning direction (Y direction). Hence, a set of heads R1 and R2 that elect the same liquid has an effective image-forming width L1 that is twice the image-forming width L0 of each head. Heads G1 and G2 and heads B1 and B2 are arranged in parallel in the main scanning direction (Y direction) in the same manner.

In another embodiment, the number of nozzle lines in the nozzle band 56*c* is not limited to two, and may be one. Also, the arrangement of the ejection heads 34 in the head unit 12 is not limited to the above.

The control system of the ejection apparatus 2 will now be described. FIG. 4 is a block diagram of the control system of the ejection apparatus 2. As shown in FIG. 4, the control system of the election head 2 includes a driving section 58 including drivers that control the election heads 34, the work transport mechanism 10, the head transport mechanism 14, the weighing mechanism 38 and other devices, and the control section 40 that controls the ejection apparatus including the driving section 58 as a whole.

The driving section 58 includes a transport driver 60 that separately controls the operations of the linear motors of the work transport mechanism 10 and the head transport mechanism 14, a head driver 36 that controls the operation of the ejection heads 34, and a weighing driver 62 that controls the operation of the weighing mechanism 38. The driving section 58 further includes a maintenance driver (not shown) that controls the operation of the maintenance mechanism.

The control section 40 includes a CPU 64, a ROM 66, a RAM 68 and a P-CON 70. These devices are connected to each other through a bus 72. The P-CON 70 is connected to a host computer 74. The ROM 66 has a control program region in which a control program and such that will be processed in the CPU 64 are stored, and a control data region in which control data used for forming images and for functional recovery are stored.

The RAM 68 has an image-forming data storage region in which image-forming data used for forming images on a work W are stored, a position data storage region in which position data of the work W and ejection heads 34 (more specifically, nozzle bands 56*c*) are stored, and other storage regions. The RAM 68 is thus used as a working area for control. The P-CON 70, which is connected to the drivers of the driving section 58, includes a logic circuit therein that complements the function of the CPU 64 and deals with signals of interfaces with peripheral circuits. Therefore, the P-CON 70 takes commands from the host computer 74 to the bus 72, directly or after processing, and transmits data or control signals outputted to the bus 72 from the CPU 64, directly or after processing, to the driving section 58, in conjunction with the CPU 64.

The CPU 64 receives detection signals, commands and data through the P-CON 70 according to the control program in the ROM 66, processes data in the RAM 68, and outputs control signals to the driving section 58 through the P-CON 70, thus controlling the entire ejection apparatus 2. For example, the CPU 64 controls the ejection heads 34, the work transport mechanism 10 and the head transport mechanism 14 so that the head unit 12 opposes the work W. Then, the CUP 64 sends control signals to the head driver 36 in synchronization with the relative movement of the head unit 12 and the work W so that droplets of a liquid are ejected onto the work W through the nozzles 56 of each ejection head 34 mounted on the head unit 12. In this instance, it is referred to as main scanning that droplets are ejected in synchronization with the movement of the work W in the Y direction, and it is referred to as sub scanning that the head unit 12 is moved in the X direction. The ejection apparatus 2 used in the present embodiment can form images by ejecting a liquid by repeating a combined operation of the main scanning and the sub scanning several times. For the main scanning, the work W is not necessarily moved in one direction relative to the ejection heads 34, and may be reciprocally moved.

The encoder 24 is electrically connected to the head driver 36, and generates encoder pulses in connection with the main scanning. In the main scanning, since the movable platen 18 is moved at a predetermined speed, the encoder pulses are periodically generated.

For example, when the moving speed of the movable platen 18 is 200 mm/s for the main scanning and the ejection frequency (ejection timing for continuously electing droplets) of the ejection heads 34 is 20 kHz, the resolution in ejecting droplets in the main scanning direction, which is calculated by dividing the moving speed by the driving frequency, is 10 μm. Hence, the election apparatus 2 can deposit droplets on the work W at a pitch of 10 μm. In practice, the ejection timing depends on a latch signal generated by counting the periodically generated encoder pulses.

The host computer 74 sends control information, such as a control program and control data, to the ejection apparatus 2. The host computer 74 also serves as a disposition information generator that generates disposition information as ejection control data used for depositing a predetermined amount of droplets in each deposition region on the work W. The disposition information includes, for example in a bit map, election positions in the deposition region where droplets will be deposited (in other words, relative positions of the work W and the nozzles 56), the number of deposited droplets (in other words, the number of ejection operations for each nozzle 56), on-off data of the nozzles 56 in the main scanning, and ejection timing. The host computer 74 may correct the disposition information temporarily stored in the RAM 68, in addition to generating disposition information.

Light-Emitting Device

Figure 5:
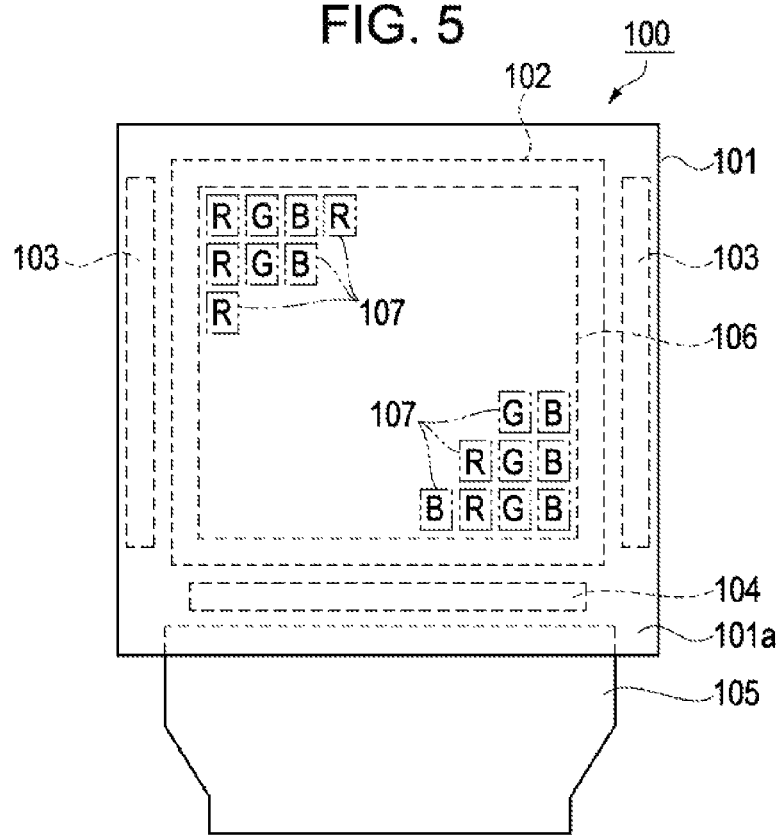
FIG. 5 is a schematic front view of a light-emitting device according to an embodiment of the invention.
Figure 6:
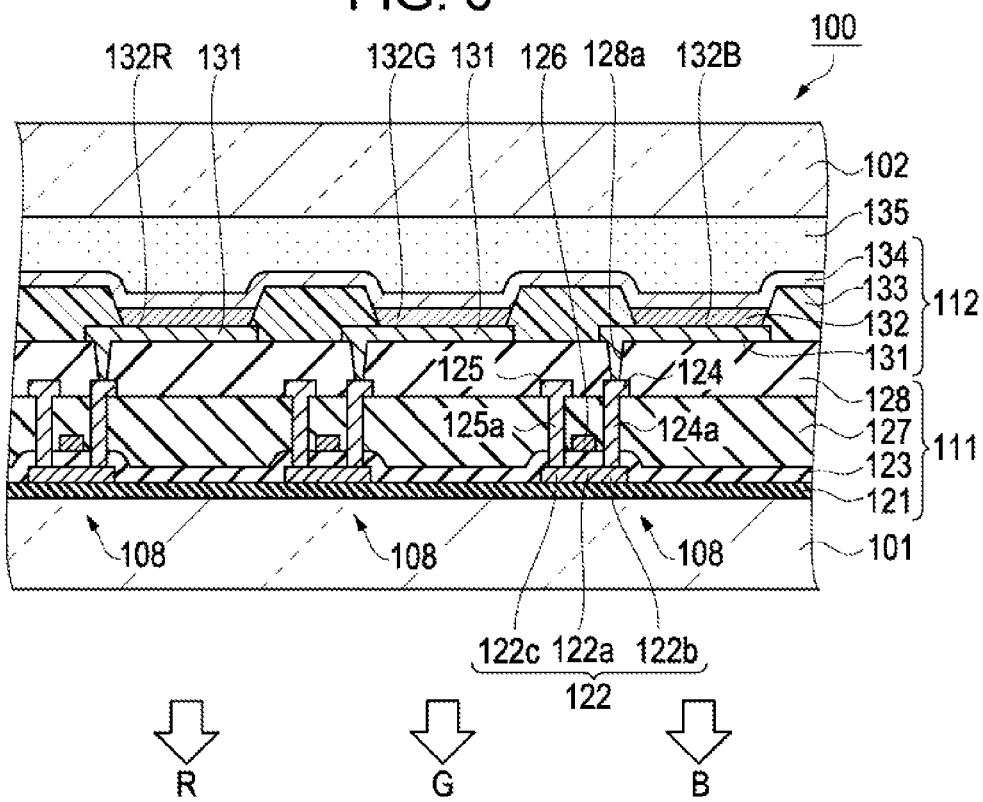
FIG. 6 is a schematic sectional view of a principal part of a light-emitting device according to an embodiment of the invention.

A light-emitting device including light emitting elements produced by a method for manufacturing a light-emitting element according to an embodiment of the invention will now be described with reference to FIGS. 5 and 6. FIG. 5 is a schematic front view of a light-emitting device (organic EL device) according to the present embodiment, and FIG. 6 is a schematic sectional view of a principal part of the light-emitting device.

As shown in FIG. 5, the light-emitting device or organic EL device 100 of the present embodiment includes an element substrate 101 having light-emitting pixels 107 of three colors red (R), green (G) and blue (B), and a sealing substrate 102 opposing the element substrate 101 with a distance therebetween. The sealing substrate 102 and the element substrate 101 are bonded together with an air-tight sealing agent so as to seal the light-emitting region 106 in which the light-emitting pixels 107 are arranged.

Each light-emitting pixel 107 includes an organic EL element 112 (see FIG. 6) acting as a light-emitting element. The light-emitting pixels 107 are arranged in a striped manner where the same color pixels 107 that emit the same color light are aligned, for example, in is vertical direction as shown in FIG. 5. The light-emitting pixels 107 are very small in practice, but are shown in an enlarged scale in the figure for a reason of drawing.

The element substrate 101 is slightly larger than the sealing substrate 102, and the portion of the element substrate 101 jutting out in a frame manner is provided with two scanning driving circuit portions 103 and one data line driving circuit portion 104. These driving circuit portions drive the light-emitting pixels 107. The scanning line driving circuit portion 103 and the data line driving circuit portion 104 may be, for example, an IC, in which electrical circuits are integrated, mounted in the element substrate 101, or may be directly formed on the surface of the element substrate 101.

The element substrate 101 has a terminal portion 101a, and a relay board 105 is mounted to the terminal portion 101a for connecting the scanning line driving circuit portion 103 and the data line driving circuit portion 104 to an external circuit. A flexible circuit board may be used as the relay board 105.

In organic EL device 100, the organic EL elements 112 each include an anode 131 acting as a pixel electrode, a partition member 133 separating the anode 131 from the other anodes, and a function layer defined by organic layers on the anode 131 including a luminescent layer, as shown in FIG. 6. The organic EL element 112 further includes a cathode 134 opposing the anode 131 with the function layer therebetween. The cathode 134 is a common electrode of all the organic EL elements 112.

The partition member 133 is made of a photosensitive resist that may be repellent to the function layer ink described later or may have been plasma-treated with, for example, $CF_4$ to impart lyophobicity. For example, the photosensitive resist may be a lyophobic resist composition containing a photosensitive acrylic resin and a fluorocarbon polymer, as disclosed in JP-A-2008-287251. The partition member 133 covers outer portions of the anodes of the light-emitting pixels 107 so as to separate the anodes 131 from one another.

Each anode 131 is connected to one of three terminals of a corresponding TFT 108 formed on the element substrate 101, and may be made of, for example, indium tin oxide (ITO), which is a transparent electrode material, and have a thickness of about 100 nm.

The cathode 134 is made of a reflective elemental metal, such as Al or Ag, or an alloy of the reflective elemental metal and other metals such as Mg.

The organic EL device 100 of the present embodiment is of a bottom emission type. In this type of organic EL device, light is emitted from the function layer 132 by applying a driving current between the anode 131 and the cathode 134 and is reflected from the cathode 134, thus extracted through the element substrate 101. Therefore, the element substrate 101 is made of a transparent material, such as glass. The sealing substrate 102 may be transparent or opaque. If an opaque sealing substrate is used, it may be made of ceramic, such as alumina, stainless steel or other metals subjected to surface oxidation or other insulation treatment, thermosetting resin, or thermoplastic resin.

The element substrate 101 is provided with a circuit portion 111 thereon that drives the organic EL elements 112. More specifically, a base protection layer 121 mainly made of $SiO_2$ is formed as an undercoat layer over the surface of the element substrate 101, and semiconductor layers 122 made of polysilicon or the like are disposed on the base protection layer 121. A gate insulating layer 123 mainly made of $SiO_2$ and/or SiN is formed over the surfaces of the semiconductor layers 122.

The portion of the semiconductor layer 122 underlying a gate electrode 126 with the gate insulating layer 123 therebetween is a channel region 122a. The gate electrode 126 is a part of a scanning line (not shown). A first insulating interlayer 127 mainly made of $SiO_2$ is formed over the surface of the gate insulating layer 123 covering the semiconductor layers 122 and having the gate electrodes 126 thereon.

The semiconductor layer 122 has a lightly doped drain (LDD) structure in which a lightly doped source region and a heavily doped source region 122c are formed at the source side of the channel region 122a while a lightly doped drain region and a heavily doped drain region 122b are formed at the drain side of the channel region 122a. The heavily doped source region 122c is connected to a source electrode 125 through a contact hole 125a passing through the gate insulating layer 123 and the first insulating interlayer 127. The source electrode 125 acts as part of a power line (not shown). The heavily doped source region 122c is connected to a drain electrode 124, which lies in the same layer as the source electrode 125, through a contact hole 124a passing through the gate insulating layer 123 and the first insulating interlayer 127.

The first insulating interlayer 127 on which the source electrodes 125 and the drain electrodes 124 were formed is covered with a planarizing layer 128. The planarizing layer 128 is made of, for example, a heat-resistant acrylic or polyimide resin, and is a known layer intended to eliminate the unevenness formed due to the presence of the TFT elements 108, the source electrodes 125 the drain electrodes 124 and so forth.

Then, the anodes 131 are disposed on the surface of the planarizing layer 128 and each connected to the corresponding drain electrode 124 through a contact hole 128a in the planarizing layer 128. Hence, each anode 131 is connected to the heavily doped drain region 122b of the semiconductor layer 122 via the drain electrode 124. The cathode 134 is connected to the ground. Thus, each TFT element 108, which acts as a switching element, controls a driving current that is applied from the power line to the anode 131 and flows to the cathode 134. Consequently, the circuit portion 111 allows desired one or more organic EL elements 112 to emit light so as to display a color image.

However, the circuit portion 111 that drives the organic EL elements 112 is not limited to the above structure.

The function layer 132 is defined by organic thin layers including a hole infection layer, a hole transport layer and a luminescent layer that are formed in that order on the anode 131. In the present embodiment, these thin layers are formed by liquid coating or vacuum vapor deposition. The liquid coating may be performed by a liquid election method using the above-described election apparatus 2 or a spin coating method.

Exemplary materials of the hole injection layer include, but are not limited to, poly(3,4-ethylenedioxythiophene)/poly(styrene sulfonic acid) (PEDOT/PSS), PEDOT/PSS/Nafion (registered trademark of DuPont), polythlophene and its derivatives, polyaniline and its derivatives, polypyrrole and its derivatives, and N,N,N',N'-tetraphenyl-p-diaminobanzene and its derivatives. These materials may be used singly or in combination. The hole injection layer may he formed of a function layer ink according to an embodiment of the invention, as will be described later.

The hole injection layer preferably has an average thickness of, but not limited to, about 10 to 100 nm, more preferably about 10 to 50 nm.

The hole transport layer is provided between the hole injection layer and the luminescent layer, and is intended to enhance the ability to transport or inject holes to the luminescent layer and intended to inhibit electrons from entering the hole injection layer from the luminescent layer. Thus, the hole transport layer helps holes combine with electrons in the luminescent layer to enhance the luminescence efficiency.

The hole transport layer may also be formed of a function layer ink according to an embodiment of the invention, as will be described later. The material of the hole transport layer may be a macromolecular material, a p-type low-molecular-weight material, or their combination.

P-type macromolecular materials (organic polymers) include polymers having an arylamine skeleton, such as poly(2,7-(9,9-di-n-octylfluorene)-(1,4-phenylene-((4-sec-butylphenyl)imino)-1,4-phenylene)) (TEB) and other polyarylamines, polymers having a fluorene skeleton, such as fluorene-bithiophene copolymers, polymers having both an arylamine skeleton and a fluorene skeleton, such as fluorene-arylamine copolymers; poly(N-vinylcarbazole), polyvinylpyrene, polyvinylanthracene, polythiophene, polvalkylthiophene, polyhexylthiophene, poly(p-phenylenevinylene), poly(thienylene vinylene), pyrene formaldehyde resin, ethylcarbazole formaldehyde resin, and their derivatives.

These p-type macromolecular materials may be used as a mixture with other compounds. For example, a mixture containing polythiophene may be used, such as poly(3,4-ethylenedioxythiophene)/poly(styrene sulfonic acid) (hereinafter expressed by PEDOT/PSS).

P-type low-molecular-weight materials include arylcycloalkane compounds, such as 1,1-bis(4-di-p-triaminophenyl)cyclohexane and 1,1'-bis(4-di-p-tolylaminophenyl)-4-phenylcyclohexane; arylamine compounds, such as 4,4',4''-trimethyltriphenylamine, N,N,N',N'-tetraphenyl-1,1'-biphenyl-4,4'-diamine, N,N'-diphenyl-N,N'-bis(3-methylphenyl)-1,1'-biphenyl-4,4'-diamine (TPD1), N,N'-diphenyl-N,N'-bis(4-methoxyphenyl)-1,1'-biphenyl-4,4'-diamine (TPD2), N,N,N',N'-tetrakis(4-methoxyphenyl)-1,1'-biphenyl-4,4'-diamine (TPD3), N,N'-bis(1-naphthyl)-N,N'-diphenyl-1,1'-biphenyl-4,4'-diamine (α-NPD), and TPTE; phenylenediamine compounds, such as N,N,N',N'-tetraphenyl-p-phenylenediamine, N,N,N',N'-tetra(p-tolyl)-p-phenylenediamine, and N,N,N',N'-tetra (m-tolyl)-m-phenylenediamine (PDA); carbazole compounds, such as carbazole, N-isopropylcarbazole, and N-phenylcarbazole; stilbene compounds, such as stilbene and 4-di-p-tolylaminostilbene; oxazole compounds, such as OxZ; triphenylmethane compounds, such as triphenylmethane and m-MTDATA; pyrazoline compounds, such as 1-phenyl-3-(p-dimethylaminophenyl)pyrazoline; benzine(cyclohexadiene) compounds; triazole compounds such as triazole; imidazole compounds such as imidazole; oxadiazole compounds, such as 1,3,4-oxadiazole and 2,5-di(4-dimethylaminophenyl)-1,3,4-oxadiazole; anthracene compounds, such as anthracene and 9-(4-diethylaminostyryl) anthracene; fluorenone compounds, such as fluorenone, 2,4,7-trinitro-9-fluorenone, and 2,7-bis(2-hydroxy-3-(2-chlorophenylcarbamoyl)-1-naphthylazo)fluorenone; aniline compounds, such as polyaniline; silane compounds; pyrrole compounds, such as 1,4-dithioketo-3,6-diphenylipyrro-3,4-c)pyrropyrrole; fluorene compounds, such as fluorene; porphyrin compounds, such as porphyrin and metal tetraphenyl porphyrins; quinacridone compounds, such as quinacridone; metal or non-metal phthalocyanine compounds, such as phthalocyanine, copper phthalocyanine, tetra-t-butyl copper phthalocyanine, and iron phthalocyanine; metal or non-metal naphthalocyanine compounds, such as copper naphthalocyanine, vanadyl naphthalocyanine, and monochloro gallium naphthalocyanine; and benzidine compounds, such as N,N'-di(naphthalene-1-yl)-N,N'-diphenylbenzidine, and N,N,N',N'-tetraphenylbenzidine.

The hole transport layer preferably has an average thickness of, but not limited to, about 10 to 150 nm, more preferably about 10 to 100 nm. The hole transport layer may be omitted.

Red Luminescent Layer

The red luminescent layer contains a red luminescent material that can emit red light. The red luminescent layer may be formed of a function layer ink, described later, according to an embodiment of the invention. Any red luminescent material can be used without particular limitation, and red fluorescent materials and red phosphorescent materials may be used singly or in combination.

Exemplary red fluorescent materials include perylene derivatives, europium benzopyran derivatives, rhodamine derivative benzothioxanthene derivatives, porphyrin derivatives, nile red, 2-(1,1-dimethylethyl)-6-(2-(2,3,6,7-tetrahydro-1,1,7,7-tetramethyl-1H,5H-benzo(ij)quinolizine-9- yl)ethenyl)-4H-pyran-4H-ylidene)propanedinitrile (DCJTB), and 4-(dicyanomethylene)-2-methyl-6-(p-dimethylaminostyryl)-4H-pyran (DCM), and any material can be used as long as it can emit red fluorescence.

Exemplary red phosphorescent materials include metal complexes, such as those of iridium, ruthenium, platinum, osmium, rhenium, and palladium, and any material can be used as long as it can emit red phosphorescence. At least one of the ligands of the metal complex may have a phenylpyridine skeleton, a bipyridyl skeleton, a porphyrin skeleton or the like. More specifically, examples of such a red phosphorescent material include tris(1-phenylisoquinoline) iridium, bis[2-(2'-benzo[4,5-α]thienyl)pyridinato-N,C3'] iridium (acetylacetonate) (btp2Ir(acac)), 2,3,101,12,13,17, 18-octaethyl-12H,23H-porphyrin-platinum (II), bis[2-(2'-benzo[4,5-α]thienyl)pyridinato-N,C3']iridium, and bis (2-phenylpyridine)iridium (acetylacetonate).

The red luminescent layer may further contain a host material of the red luminescent material. In this instance, the red luminescent material acts as a guest material.

The host material forms excitons from injected holes and electrons, and transfers the energy of the excitons to the red luminescent material (Ferster transfer or Dexter transfer) to excite the red luminescent material. For use of such a host material, for example, the host material may be doped with the red luminescent material as a guest material.

Any material having the above-described functions can be used as a host material without particular limitation. If the red luminescent material contains a red fluorescent material, the host material may be selected from among naphthacene derivatives, naphthalene derivatives, scene derivatives (scene materials) such as anthracene derivatives, distyrylarylene derivatives, perylene derivatives, distyrylbenzene derivatives, distyrylamine derivatives, quinolinolate metal complexes such as tris(8-quinolinolate) aluminum complex (Alq3), triarylamine derivatives such as tetrameric triphenylamine, oxadiazole derivatives, silole derivatives, dicarbazole derivatives, oligothiophene derivatives, benzopyran derivatives, triazole derivatives, benzoxazole derivatives, benzothiazole derivatives, quinoline derivatives, and 4,4'-bis(2,2'-diphenylvinyl)biphenyl (DPVBi). These materials may be used singly or in combination.

If a red luminescent material (guest material) and a host material are used in combination, the luminescent material content (amount of dopant) in the red luminescent layer is preferably 0.01% to 10% by weight, and more preferably 0.1% to 5% by weight. By controlling the red luminescent material content in such a range, the luminescence efficiency can be optimized.

The red luminescent layer preferably has an average thickness of, but not limited to, about 10 to 150 nm, more preferably about 10 to 100 nm.

Green Luminescent Layer

The green luminescent layer contains a green luminescent material that can emit green light. The green luminescent layer may be formed of a function layer ink, described later, according to an embodiment of the invention. Any green luminescent material can be used without particular limitation, and green fluorescent materials and green phosphorescent materials may he used singly or in combination.

Exemplary green fluorescent materials include coumarin derivative, quinacridone and its derivatives, and 9,10-bis[(9-ethyl-3-carbazole)-vinylenyl]-anthracene, and any material can be used as long as it can emit green fluorescence.

Green phosphorescent materials include metal complexes, such as those of iridium, ruthenium, platinum, osmium, rhenium, and palladium, and any material can be used without particular limitation as long as it can emit green phosphorescence. More specifically, examples of such a metal complex include fac-tris(2-phenylpyridine) iridium (Ir(ppy)3), bis(2-phenylpyridinato-N,C2')iridium (acetylacetonate), and fac-tris[5-fluoro-2-(5-trifluoromethyl-2-pyridine)phenyl-C,N] iridium.

The green luminescent layer may further contain a host material of the green luminescent material. In this instance, the green luminescent material acts as a guest material.

The materials cited as the host material of the red luminescent layer may be used as the host material of the green luminescent layer.

Blue Luminescent Layer

The blue luminescent layer contains a blue luminescent material that can emit blue light. The blue luminescent layer may be formed of a function layer ink, described later, according to an embodiment of the invention. Any blue luminescent material can be used without particular limitation, and blue fluorescent materials and blue phosphorescent materials may be used singly or in combination.

Exemplary blue fluorescent materials include distyrylamine derivatives such as distyryldiamine compounds, fluoranthene derivatives, pyrene derivatives, perylene and perylene derivatives, anthracene derivatives, benzoxazole derivatives, benzothiazole derivatives, benzoimidazole derivatives, chrysene derivatives, phenanthrene derivatives, distyrylbenzene derivatives, tetraphenylbutadiene, and 4,4'-bis(9-ethyl-3-carbazovinylene)-1,1'-biphenyl (BCzVBi), and any material can be used without particular limitation as long as it can emit blue fluorescence.

Blue phosphorescent materials include metal complexes, such as those of iridium, ruthenium, platinum, osmium, rhenium, and palladium, and any material can be used without particular limitation as long as it can emit blue phosphorescence. More specifically, examples of such a metal complexes include bis[4,6-difluorophenylpyridinato-N,C2']-picolinate-iridium, tris[2-(2,4-difluorophenyl) pyridinato-N,C2'] iridium, bis[2-(3,5-trifluoromethyl) pyridinato-N,C2']-picolinate-iridium, and bis(4,6-difluorophenylpyridinato-N,C2')iridium (acetylacetonate).

The blue luminescent layer may further contain a host material of the blue luminescent material. In this instance, the blue luminescent material acts as a guest material.

The materials cited as the host material of the red luminescent layer may be used as the host material of the blue luminescent layer.

Since the function layer materials for forming any of the red luminescent layer, the green luminescent layer and the blue luminescent layer are low-molecular-weight materials containing a host material and a guest, the luminescent lavers are formed, in general, by gas-phase growth, such as vacuum vapor deposition. However, a liquid election method may be applied to those low-molecular-weight materials. Of course, a macromolecular material suitable for the liquid ejection method may be used in a function layer ink.

An electron transport layer and an electron injection layer are disposed, in that order from the luminescent layer side, between each luminescent layer and the cathode 134. The electron transport layer transports electrons injected from the cathode 134 through the electron injection layer to the luminescent layer.

The electron transport layer contains an electron transport material. Examples of the electron transport material include quinoline derivatives such as tris (8-quinolinolato) aluminum ($Alq_3$) and other organic metal. complexes including 8-quinolinol or its derivative as a ligand, oxadiazole derivatives, perylene derivatives, pyridine derivatives, pyrimidine derivatives, quinoxaline derivatives, diphenylquinone derivatives, and nitro-substituted fluorene derivatives. These compounds may be used singly or in combination.

The electron transport layer preferably has an average thickness of, but not limited to, about 0.5 to 100 nm, more preferably about 1 to 50 nm. The electron transport layer may be omitted.

The electron injection layer enhances the efficiency of electron injection from the cathode 134. The electron injection layer is made of an electron injection material such as inorganic insulating material or an inorganic semiconductor material.

Examples of the inorganic insulating material include alkali metal chalcogenides (oxides, sulfides, selenides, tellurides), alkaline-earth metal chalcogenides, alkali metal halides and alkaline-earth metal halides. These materials may be used singly or in combination. The electron injection layer mainly containing such a material can exhibit higher electron injection ability. In particular, alkali metal compounds (such as alkali metal chalcogenides and alkali metal halides) have very low work functions. By using such a material in the electron injection layer, the organic EL element 112 can emit light with a high luminance.

Exemplary alkali metal chalcogenides include $Li_2O$, LiO, $Na_2S$, $Na_2Se$, and NaO. Exemplary alkaline-earth metal chalcogenides includes CaO, BaO, SrO, BeO, BaS, MgO, and CaSe. Exemplary alkali metal halides include CsF, LiF, NaF, KF, LiCl, KCl, and NaCl. Exemplary alkali-earth metal halides include $CaF_2$, $BaF_2$, $SrF_2$, $MgF_2$, and $BeF_2$.

Examples of the inorganic semiconductor material used as the electron injection material include oxides, nitrides and oxynitrides containing at least one element selected from the groups consisting of Li, Na, Ba, Ca, Sr, Yb, Al, Ga, In, Cd, Mg, Si, Ta, Sb and Zn. These materials may be used singly or in combination.

The electron injection layer preferably has an average thickness of, but not limited to, about 0.1 to 1000 nm, more preferably about 0.2 to 100 nm, and still more preferably about 0.2 to 50 nm. The electron. injection layer may be omitted.

The electron transport layer, the electron injection layer and the cathode 134, which are disposed over the luminescent layer, are preferably formed by a process performed under reduced pressure, such as vacuum vapor deposition or sputtering, avoiding water and oxygen that are liable to degrade the function of the thin organic luminescent layer.

The element substrate 101 having the organic EL elements 112 is tightly sealed with a sealing substrate 102 with a sealing layer 135 therebetween which is a sealing member made of a thermosetting resin or the like.

The organic EL elements 112 of the present embodiment, which are manufactured by a method described later, each include a luminescent layer having a substantially uniform thickness and a stable sectional shape. Thus, the function layers 132R, 132G and 132B of different colors each produce luminescence having desired characteristics.

Although the organic EL device 100 of the present embodiment is of bottom. emission type, a top emission organic EL device may be provided in another embodiment. The top emission organic EL device includes, for example, an anode made of a light-reflective electroconductive material and a common cathode 134 made of a transparent electroconductive material. In this type of organic EL device, light emitted from the organic EL element 112 is reflected from the anode 131 and extracted through the sealing substrate 102. For a top emission type, color filters corresponding to the luminescent colors of the organic EL elements 112 may be provided near the sealing substrate 102. In this instance, the organic EL elements 112 may produce white luminescence.

Method for Manufacturing Light-Emitting Element

A method for manufacturing the organic EL element 112 will now be described by way of example of the method for manufacturing a light-emitting element according to the invention, with reference to FIGS. 7 to 9E. FIG. 7 is a flow diagram of a method for manufacturing an organic EL element according to an embodiment of the invention. FIGS. 8A to 8D and 9E to 9I are schematic sectional views illustrating the method of the embodiment.

As shown in FIG. 7, the method for manufacturing an organic EL element 112 includes forming a partition member (Step S10), treating the surface of a substrate having the partition member (Step S20), forming hole injection layers (Step S30), forming hole transport layers (Step S40), forming luminescent layers (Step S50), forming a cathode (Step S60), and binding the element substrate 101 having the organic EL element and a sealing substrate 102 together (Step S70). Although the method also includes steps of forming a circuit portion 111 on the element substrate 101, and of forming anodes 131 electrically connected to the circuit portion 111, these steps can be performed by known processes, and thus detailed description thereof is omitted.

Figure 8A:
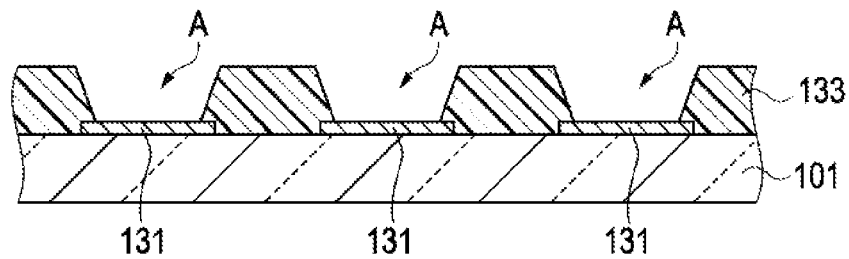
FIGS. 8A to 8D are schematic sectional views illustrating a method for manufacturing an organic EL element according to an embodiment of the invention.

Step S10 shown in FIG. 7 is the step of forming a partition member. In Step S10, as shown in FIG. 8A, a partition member 133 is formed so as to cover outer portions of the anodes 131 to separate the anodes 131 from one another. More specifically, for example, a photosensitive phenol or polyimide resin is applied at a thickness of about 1 to 3 μm on the surface of the element substrate 101 on which the anodes 131 have been formed. For applying the resin, for example, a transfer method or a slit coating method may be used. The applied resin is exposed to light through a mask having a pattern corresponding to the shape of the light-emitting pixels 107 and is followed by development, this forming a partition member 133 corresponding to the light-emitting pixels 107. Each of the regions corresponding to the light-emitting pixels 107, partitioned by the partition member 133 is hereinafter referred to as a deposition region A. Then, Step S20 is performed.

Step S20 in FIG. 7 is the step of surface treatment. In Step S20, the surface of the element substrate 101 having the partition member 133 is subjected to lyophilic treatment and lyophobic treatment. First, lyophilic treatment is performed on the surfaces of the anodes 131, which are mainly made of an inorganic material, by plasma treatment using oxygen as a treatment gas. Subsequently, lyophobic treatment is performed on the surface of the partition member 133, which is mainly made of an organic material, by introducing fluorine-based gas such as $CF_4$ into the surface of the partition member 133 by plasma treatment using the fluorine-based gas. Then, Step S30 is performed.

Figure 8B:
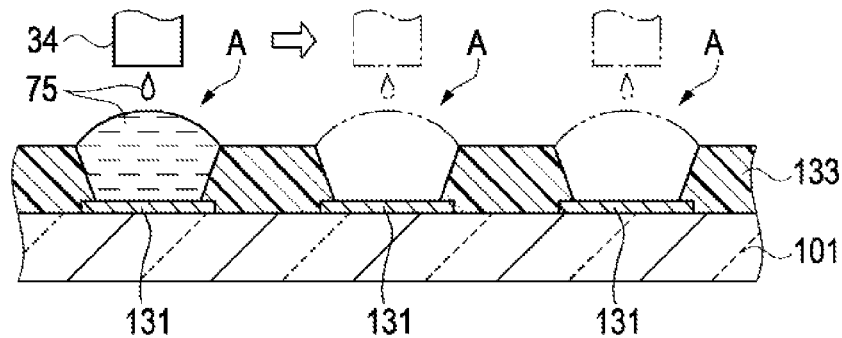

Step S30 in FIG. 7 is the step of forming hole injection layers. In Step S30, first, a liquid 75 containing a hole injection layer material is applied to the deposition regions A, as shown in FIG. 8B. The liquid 75, which is an example of the function layer ink of the invention, contains a mixed solvent described later, and about 0.5% of a p-type macromolecular material or low-molecular-weight material as the hole injection layer material.

The liquid 75 may be applied using an ejection apparatus 2 that can eject the liquid (ink) through nozzles 56 of the ejection head 34. In this instance, the liquid 75 is ejected from the ejection head 34 to the element substrate 101, or work W, opposing the ejection heads 34. On ejecting the liquid 75, droplets of the liquid 75 land on the anodes 131 subjected to the lyophilic treatment and spread over the surfaces of the anodes 131. The amount of the liquid 75 to be elected is controlled according to the area of the deposition regions A so that the hole injection layer will have a thickness of about 50 to 70 nm after being dried. Then, drying is performed.

Figure 8C:
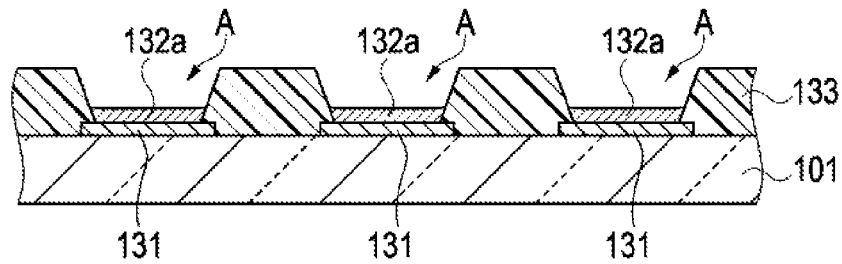

In this drying step, the solvent in the liquid 75. is removed, for example, by drying the element substrate 101 under reduced pressure and heating the element substrate 101 by lamp annealing. Thus, hole injection layers 132a are formed on the anodes 131 in the deposition regions A, as shown in FIG. 8C. In the present embodiment, all the hole injection layers 132a are formed of the same material in the respective deposition regions A. However, different materials may be used for the hole injection layers 132a, according to the luminescent colors of the subsequently formed luminescent layers. Then, Step S40 is performed.

Figure 8D:
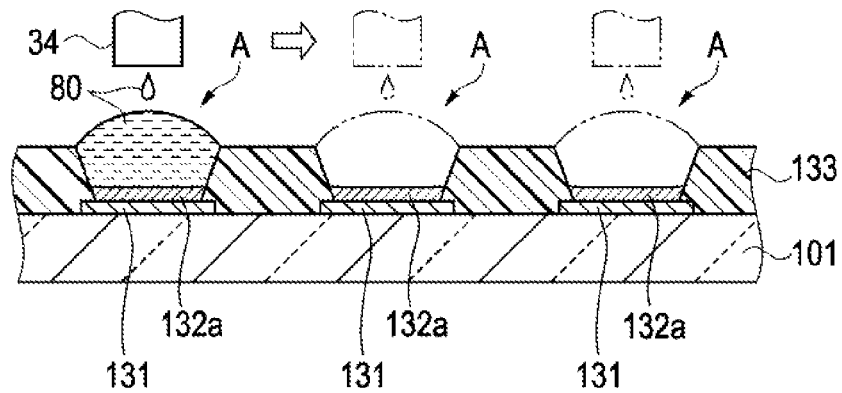

Step S40 in FIG. 7 is the step of forming hole transport layers (intermediate layers). In Step S40, first, a liquid 80 containing a hole transport layer material is applied to the deposition regions A, as shown in FIG. 8D.

If the luminescent lavers are formed on the hole transport layer by liquid coating, the liquid 80 may contain cyclohexylbenzene as a solvent and about 0.25% by weight of a p-type macromolecular or low-molecular-weight material as described above as the hole transport layer material.

If the luminescent layers are formed by vacuum vapor deposition, like the luminescent layers 90 (90r, 90g and 90b) shown in FIG. 9H, the liquid 80 may contain a mixed solvent described later as a solvent and about 0.25% by weight of a p-type macromolecular or low-molecular-weight material as described above as the hole transport layer material. In other words, the luminescent layers may be formed by vacuum vapor deposition as well as liquid coating.

The liquid 80 is applied using the ejection apparatus 2 as in the case of applying the liquid 75. The amount of the liquid 80 to be elected is controlled according to the area of the deposition regions A so that the hole transport layer will have a thickness of about 10 to 30 nm after being dried. Then, drying is performed.

In this drying step, the solvent in the liquid 80 is removed, for example, by drying the element substrate 101 under reduced pressure and heating the element substrate 101 by lamp annealing. Thus, hole transport lavers 132c are formed on the hole injection lavers 132a in the deposition regions A, as shown in FIG. 9E. Then, Step S50 is performed.

Step S50 in FIG. 7 is the step of forming luminescent layers. In Step S50, first, liquids 85R, 85G and 85B each containing a luminescent material are applied to the corresponding deposition regions A, as shown in FIG. 9F.

The liquids 85R, 85G and 85B, which are examples of the functional layer ink of the invention, each contain a mixed solvent described later, and about 1.5% by weight of a macromolecular or low-molecular-weight luminescent layer material as described above.

The liquids 85R, 85G and 85B are applied by being ejected from different ejection heads 34 of the election apparatus 2.

Such a liquid ejection method allows a desired amount of the liquids 85R, 85G and 85B to be uniformly elected to the deposition regions A. The amount of the liquid to be ejected is controlled according to the area of the deposition regions A so that the luminescent layer will have a thickness of about 50 to 100 nm after being dried. Then, drying is performed.

In this drying step, the ejected liquids 85R, 85G and 85B are dried under reduced pressure and heated by lamp annealing or the like. The liquid ejection method allows a desired amount of the liquids 85R, 85G and 85B to be uniformly applied to the deposition regions A. Consequently, the resulting luminescent layers 132r, 132g and 132b have a substantially uniform. thickness in each deposition region A, as shown in FIG. 9G. Then, Step S80 is performed.

Step S60 in FIG. 7 is the step of forming a cathode. In Step S60, as shown in FIG. 9I, a cathode 134 is formed so as to cover the partition member 133 and the function layers 132R, 132G and 132B. Thus, organic EL elements 112 are completed.

Preferably, the cathode 134 is formed of some of the above-described materials in combination. An electron transport layer and an electron injection layer may be formed between each of the function layers 132R, 132G and 132B and the cathode 134, if necessary. The cathode 134 may be formed by vacuum vapor deposition, sputtering or CVD. From the viewpoint of preventing heat damage of the function layers 132R, 132G and 132B, vacuum vapor deposition is preferred. Then, Step S70 is performed.

Step S70 in FIG. 7 is the step of binding a sealing substrate. In Step S70, a transparent sealing layer 135 is formed by coating on the element substrate 101 provided with the organic EL elements 112 thereon, and is tightly and uniformly bound to the transparent sealing substrate 102 (see FIG. 6). Preferably, the sealing substrate 102 is provided with an adhesion layer in the outer region thereof to prevent the permeation of water, oxygen and the like.

The method for manufacturing the organic EL elements 112 will be further described with reference to specific Examples and Comparative Examples.

EXAMPLE 1

First, hole injection layers were formed by an ink jet method to a thickness of 50 to 60 nm on a substrate provided with anode layers thereon. After being vacuum dried, the coating was fired by heating at 150° C. The hole injection layer material was PEDOT/PSS (1/20) that had been prepared by dispersing poly(3,4-ethylenedioxythlophene), which is a polythiophene derivative, in a disperse medium polystyrene sulfonic acid to prepare a dispersion, and further dispersing the dispersion in water. At this time, in order to perform stable ejection, a solvent having a high boiling point was added to the macromolecular PEDOT/PSS. Examples of the solvent having a high boiling point include aromatic hydrocarbons, isopropyl alcohol (IPA), n-butanol, γ-butyrolactone, N-methylpyrrolidone (NMP), dimethylformamide (DMF), hexamethylphosphoramide (HMPA), dimethyl sulfoxide (DMSO), 1,3-dimethyl-2-imidazolidinone (DMI) and its derivatives, and glycol ethers such as Carbitol acetate and butyl Carbitol acetate. As an alternative to PEDOT/PSS, PEDOT/PSS/Nafion (registered trademark), polythiophene derivatives, polyaniline derivatives, and polypyrrole derivatives may be used as the hole injection layer material.

Subsequently, a solution of 0.25% by weight of macromolecular TFB in cyclohexylbenzene was elected as a hole transport layer material onto the hole injection layers by an ink let method. The coating of the hole transport layer material was dried under reduced pressure, and thus hole transport layers having a thickness of 20 nm was formed. The hole transport layers were then fired by heating at 180° C. in a nitrogen atmosphere for one hour, and from which the soluble portions the TFB hole transport layers were removed with xylene. Thus, hole transport layers insoluble organic solvents were formed. Then, solutions each containing 1.5% by weight of any of a red, a green and a blue low-molecular-weight luminescent layer material in a mixed solvent (non-aqueous solvent A+non-aqueous solvent B, shown in the tables of FIGS. 10A and 10B) were separately elected onto the hole transport layers by a liquid ejection method (ink jet method). The coatings of the luminescent layer materials were dried under reduced pressure to a thickness of 60 to 80 nm, and were subsequently fired at 160° C. in a nitrogen atmosphere for 10 minutes to yield luminescent layers.

Then, after optional electron transport layers and electron injection layers were formed by vacuum vapor deposition at a vacuum of $10^{-6}$ Torr ($1.33 \times 10^{-4}$ Pa), a cathode layer was formed.

EXAMPLE 2

Luminescent layers were formed using solutions each containing 1.5% by weight of any of the same red, green and blue low-molecular-weight luminescent materials as in Example 1 in a mixed solvent (aqueous solvent A+aqueous solvent B, shown in the table of FIG. 10C). Other steps in the process for manufacturing the organic EL elements of Example 2 were the same as in Example 1.

EXAMPLE 3

Luminescent layers were formed using solutions each containing 1.5% by weight of any of the same red, green and blue low-molecular-weight luminescent materials as in Example 1 in a mixed solvent (non-aqueous solvent A+aqueous solvent B, shown in the table of FIG. 11A). Other steps in the process for manufacturing the organic EL elements of Example 3 were the same as in Example 1.

EXAMPLE 4

Luminescent layers were formed using solutions each containing 1.5% by weight of any of the same red, green and blue low-molecular-weight luminescent materials as in Example 1 in a mixed solvent (aqueous solvent A+non-aqueous solvent B, shown in the table of FIG. 11B). Other steps in the process for manufacturing the organic EL elements of Example 4 were the same as in Example 1.

EXAMPLE 5

First, hole injection layers were formed by an ink let method to a thickness of 50 to 60 nm on a substrate provided with anode layers thereon. After being vacuum dried), the coating was fixed by heating at 150° C.

The hole injection layer material was PEDOT/PSS (1/20) that had been prepared by dispel-sing poly(3,4-ethylenedi-oxythiophene), which is a polythiophene derivative, in a disperse medium polystyrene sulfonic acid. At this time, in order to perform stable election, a solvent having a high boiling point was added to the macromolecular PEDOT/PSS. Examples of the solvent having a high boiling point include aromatic hydrocarbons, isopropyl alcohol (IPA), n-butanol, γ-butyrolactone, N-methylpyrrolidone (NMP), dimethylformamide (DMF), hexamethylphosphoramide (HMPA), dimethyl sulfoxide (DMSO), 1,3-dimethyl-2-imi-dazolidinone (DMI) and its derivatives, and glycol ethers such as Carbitol acetate and butyl Carbitol acetate. As an alternative to PEDOT/PSS, PEDOT/PSS/Nafion (registered trademark), polythiophene derivatives, polyaniline derivatives, and polypyrrole derivatives may be used as the hole injection layer material.

Then, a solution containing 0.25% by weight of a p-type low-molecular-weight material in a mixed solvent (non-aqueous solvent A+non-aqueous solvent B, shown in the tables of FIGS. 10A and 10B) was elected onto the hole injection layers by an ink let method. The coating of the hole transport layer material was dried under reduced pressure, and thus hole transport layers having a thickness of 20 nm was formed. The hole transport lavers were fired by heating at 180° C. in a nitrogen atmosphere for one hour.

Then, a red, a green and a blue low-molecular-weight luminescent material were separately deposited to form luminescent lavers through a mask by vacuum vapor deposition at a vacuum of $10^{-6}$ Torr ($1.33 \times 10^{-4}$ Pa). Subsequently, after electron transport layers and electron injection lavers were formed, a cathode layer was formed.

EXAMPLE 6

Hole transport lavers were formed using a solution containing 0.25% by weight of the same low-molecular-weight hole transport layer material as in Example 5 in a mixed solvent (aqueous solvent A+aqueous solvent B, shown in the table of FIG. 10C). Other steps in the process for manufacturing the organic EL elements of Example 6 were the same as in Example 5.

EXAMPLE 7

Hole transport lavers were formed using a solution containing 0.25% by weight of the same low-molecular-weight hole transport layer material as in Example 5 in a mixed solvent (non-aqueous solvent A+aqueous solvent B, shown in the table of FIG. 11A). Other steps in the process for manufacturing the organic EL elements of Example 7 were the same as in Example 5.

EXAMPLE 8

Hole transport lavers were formed using a solution containing 0.25% by weight of the same low-molecular-weight hole transport layer material as in Example 5 in a mixed solvent (aqueous solvent A+non-aqueous solvent B, shown in the table of FIG. 11B). Other steps in the process for manufacturing the organic EL elements of Example 8 were the same as in Example 5.

In Examples 1 to 8, any mixed solvent in the function layer inks contained 0.1% to 10% by weight of solvent A.

COMPARATIVE EXAMPLE 1

Luminescent layers were formed using solutions each containing 1.5% by weight of any of the same red, green and blue low-molecular-weight luminescent materials as in Example 1 in non-aqueous solvent B shown in the table of FIG. 12A. Other steps in the process for manufacturing the organic EL elements of Comparative Example 1 were the same as in Example 1.

COMPARATIVE EXAMPLE 2

Luminescent lavers were formed using solutions each containing 1.5% by weight of any of the same red, green and blue low-molecular-weight luminescent materials as in Example 1 in aqueous solvent B shown in the table of FIG.

12B. Other steps in the process for manufacturing the organic EL elements of Comparative Example 2 were the same an in Example 1.

COMPARATIVE EXAMPLE 3

Role transport lavers were formed using a solution containing 0.25% by weight of the same low-molecular-weight hole transport layer material as in Example 5 in non-aqueous solvent B shown in the table of FIG. 12A. Other steps in the process for manufacturing the organic EL elements of Comparative Example 3 were the same as in Example 1.

COMPARATIVE EXAMPLE 4

Hole transport layers were formed using a solution containing 0.25% by weight of the same low-molecular-weight hole transport layer material as in Example 5 in aqueous solvent B shown in the table of FIG. 12B. Other steps in the process for manufacturing the organic EL elements of Comparative Example 4 were the same as in Example 1.

COMPARATIVE EXAMPLE 5

Luminescent layers were formed using solutions each containing 1.5% by weight of any of the same red, green and blue low-molecular-weight luminescent materials as in Example 1 in non-aqueous solvent A shown in the table of FIG. 12C. Other steps in the process for manufacturing the organic EL elements of Comparative Example 5 were the same as in Example 1.

COMPARATIVE EXAMPLE 6

Luminescent layers were formed using solutions each containing 1.5% by weight of any of the same red, green and blue low-molecular-weight luminescent materials as in Example 1 in aqueous solvent A shown in the table of FIG. 12D. Other steps in the process for manufacturing the organic EL elements of Comparative Example 6 were the same as in Example 1.

COMPARATIVE EXAMPLE 7

Hole transport layers were formed using a solution containing 0.25% by weight of the same low-molecular-weight hole transport layer material as in Example 5 in non-aqueous solvent A shown in the table of FIG. 12C. Other steps in the process for manufacturing the organic EL elements of Comparative Example 7 were the same as in Example 1.

COMPARATIVE EXAMPLE 8

Hole transport layers were formed using a solution containing 0.25% by weight of the same low-molecular-weight hole transport layer material as in Example 5 in aqueous solvent A shown in the table of FIG. 12D. Other steps in the process for manufacturing the organic EL elements of Comparative Example 8 were the same as in Example 1.

The evaluation results of the Examples and Comparative Examples were shown in FIGS. 10A to 12D. FIGS. 10A to 11B also show the combinations of solvent A and solvent B of the mixed solvents in the function layer inks used in Examples 1 to 8. FIGS. 12A to 12D show the non-aqueous solvents or aqueous solvents of the function layer inks used in Comparative Examples 1 to 8.

The results show that aggregation was reduced effectively in Examples 1 to 8 in comparison with Comparative Examples 1, and suggest that Examples 1 to 8 can reduce the rate of aggregation caused by intermolecular interaction of the function layer material during drying. Consequently, uniform luminescence was produced.

In Comparative Examples 5 to 8, in which the solvent of each function layer ink was composed of solvent A having a high boiling point and a high viscosity, solvent A had a strong interaction with the function layer material, and was not sufficiently removed by drying under reduced pressure. Consequently, the function layer material migrated during firing and resulted in aggregation. Thus, uniform luminescence was not produced. Furthermore, since the solvent was not sufficiently removed, the degradation in performance of the organic EL elements was observed.

In the Examples described above, low-molecular-weight materials were used in the function layer inks. Macromolecular materials may he used in the same manner.

Second Embodiment
Electronic Apparatus

Embodiments of the electronic apparatus of the invention will now be described with reference to FIGS. 13 to 15.

The organic EL device of the first embodiment, which is a type of the light-emitting device of the invention, can display monochrome images or may display color images, depending on the luminescent materials used in the organic EL elements 112. The organic EL device 100 can be used in various types of electronic apparatuses.

Figure 13:
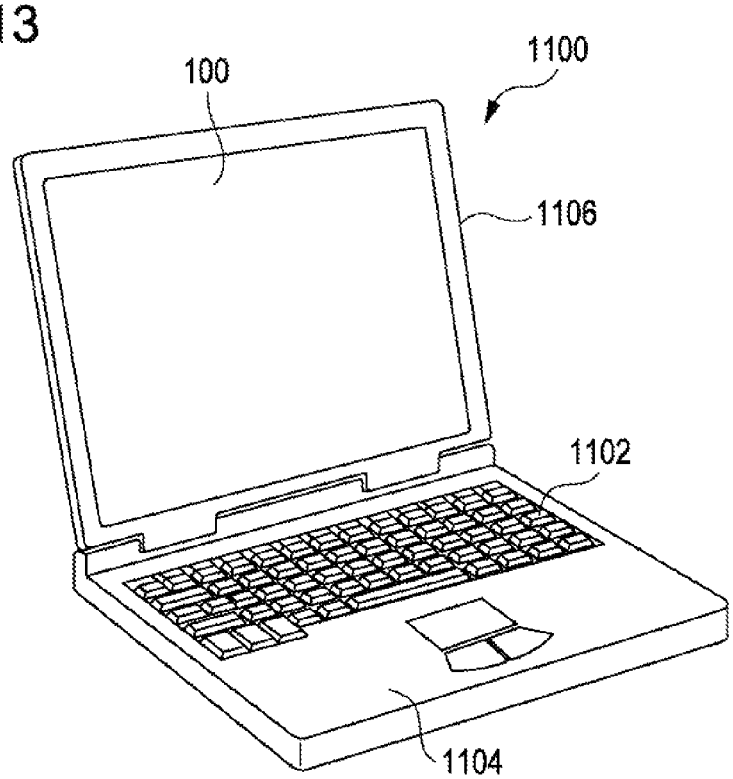
FIG. 13 is a perspective view of a mobile or notebook personal computer that is a type of electronic apparatus.

FIG. 13 is a perspective view of a mobile or notebook personal computer that is a type of electronic apparatus. In FIG. 13, the personal computer 1100 includes a body 1104 with a key board 1102, and a display unit 1106 having a display portion. The display unit 1106 is rotatably secured to the body 1104 With a hinge structure. The display portion of the display unit 1106 includes the organic EL device 100 described above.

Figure 14:
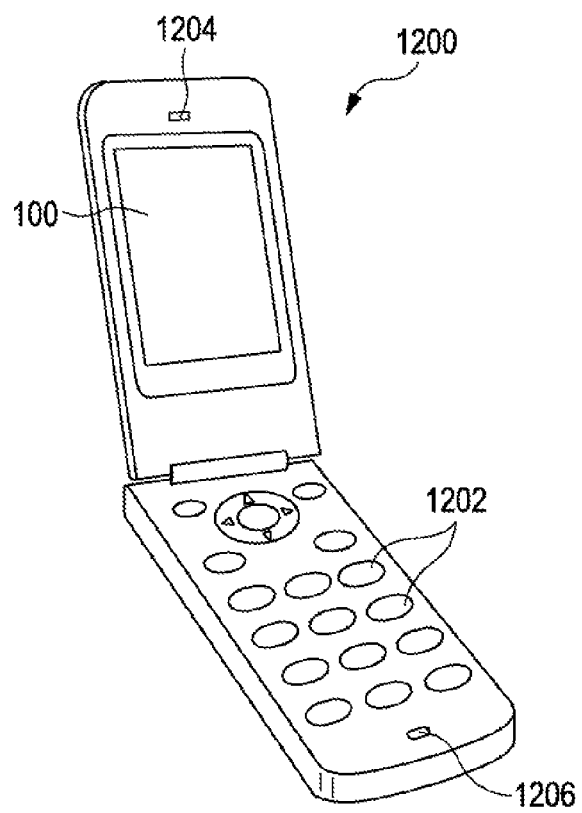
FIG. 14 is a perspective view of a mobile phone that is a type of electronic apparatus.

FIG. 14 is a perspective view of a mobile phone (including PHS) that is a type of electronic apparatus. In FIG. 4, the mobile phone 1200 includes a plurality of control buttons 1202, a receiver 1204, a microphone 1206, and a display portion. The display portion includes the above-described organic EL device 100.

Figure 15:
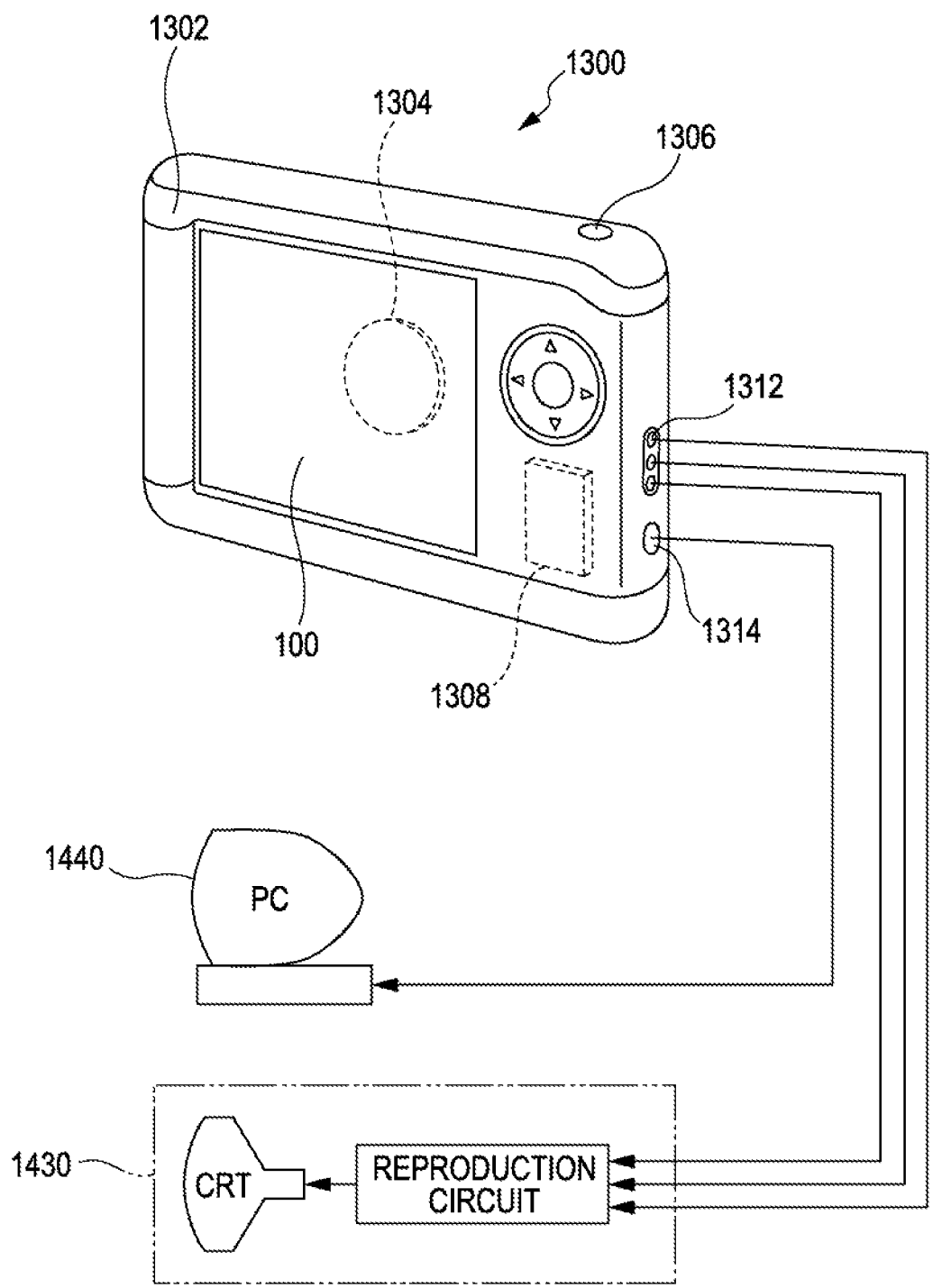
FIG. 15 is a perspective view of a digital still camera that is a type of electronic apparatus.

FIG. 15 is a perspective view of a digital still camera that is a type of electronic apparatus. FIG. 15 also schematically shows the connection between the digital still camera and external devices.

The digital still camera 1300 converts an optical image of an object into electrical signals with a Charge Coupled Device (CCD), thus producing image pickup signals (image signals).

The digital still camera 1300 includes a case or body 1302 and a display portion on the rear side of the body 1302. The display portion is configured to display images according to image pickup signals of the CCD, and functions as a finder to display an object as an electronic image.

In the digital still camera 1300, the display portion includes the above-described organic EL device 100. A circuit board 1308 is disposed within the case 1302. The Circuit board 1308 includes a memory device in which image pickup signals are stored. A light-receiving unit 1304 including an optical lens (image pickup optical system) and the CCD is disposed on the front side of the case 1302 (rear side of the figure).

The user ensures that an object to be taken is appropriately displayed on the display portion, and presses the shutter button 1305. Then the image pickup signals at that time of the CCD are transmitted to and stored in the memory device on the circuit board 1308.

The digital still camera 1300 is provided with a video signal output terminal 1312 and a data communication input terminal 1314 on a side of the case 1302. The video signal output terminal 1312 may be connected to, for example, a television monitor 1430, and the data communication input terminal 1314 may be connected to, for example, a personal computer 1440. The image pickup. signals stored in the memory device of the circuit board 1308 are output to the television monitor 1430 or the personal computer 1440 by a predetermined operation.

Since the electronic apparatuses described above each use the organic EL device 100, which makes a good show, as the display portion, the information including characters and images on the display portion can be seen with high visibility.

The electronic apparatuses according to embodiments of the invention can be applied to television sets, video cameras, viewfinder-type or monitor-direct-view-type video tape recorders, car navigation systems, pagers, electronic notebooks (may have a communication function), electronic dictionaries, electronic calculators, electronic game machines, word processors, work stations, video phones, security video monitors, electronic binoculars, POS terminals, apparatuses with a touch panel such as cash dispensers and automatic ticket vending machines, medical instruments such as electronic thermometers, blood-pressure meters, blood glucose meters, electrocardiographic monitors, ultrasonographs and endoscope monitors, fishfinders, and other measuring apparatuses or meters for vehicles, planes and ships, flight simulators, other monitors, and projection monitors such as projectors, in addition to the personal computer (mobile personal computer) 1100 shown in FIG. 13, the mobile phone 1200 shown in FIG. 14, and the digital still camera 1300 shown in FIG. 15.

Although the electronic apparatuses of the above embodiments use the organic EL device 100 as the display portion, the organic EL device 100 may be used as a light source of, for example, electrochromic light control glass, electronic paper, illuminating devices and electrophotographic printers in other embodiments.

The invention is not limited to the disclosed embodiments, and various modifications may be made within the scope and spirit of the invention as set forth in or understood from the appended claims and the description of the Specification. The invention includes thus modified function layer ink, methods for manufacturing light-emitting elements, light-emitting devices and electronic apparatuses. Various modifications of the above-described embodiments may be made. Some of the modifications will be described below.

Modifications

Figure 16A:
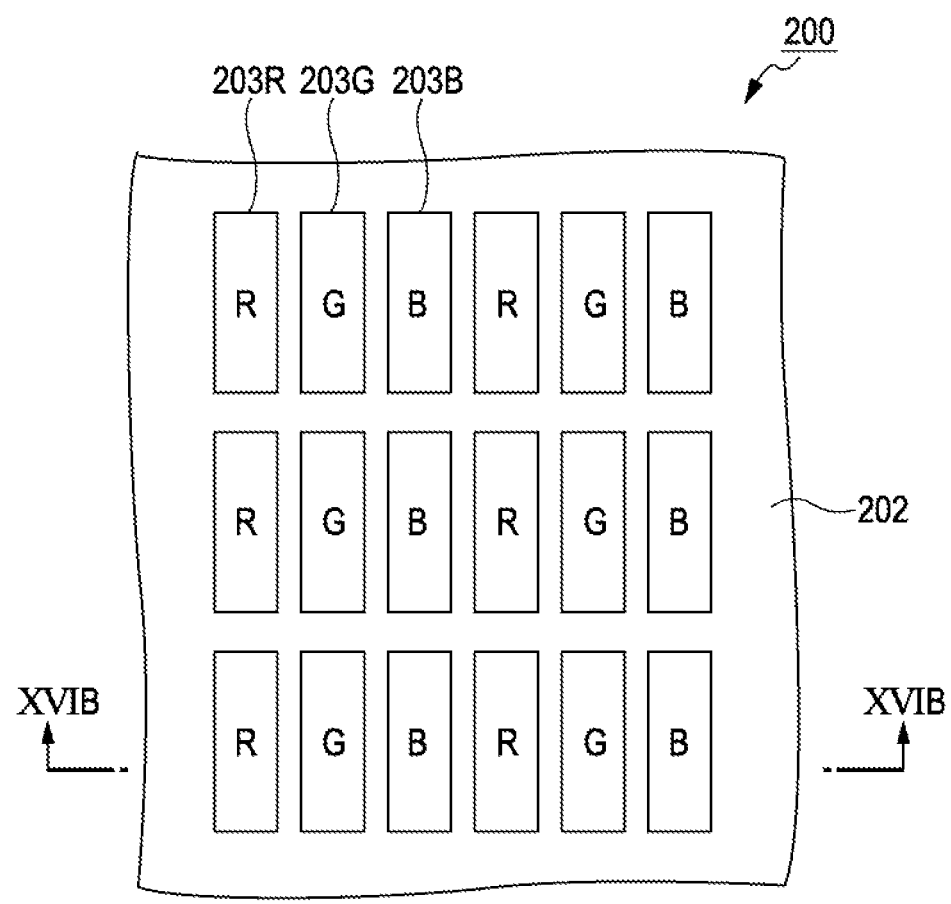
FIG. 16A is a schematic plan view of a color filter substrate.
Figure 16B:
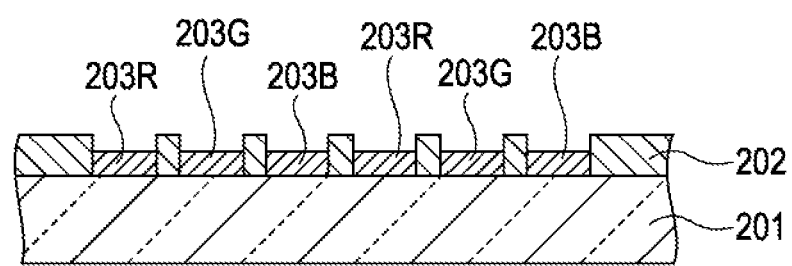
FIG. 16B is a schematic sectional view of the color filter substrate.

The function layer ink of an embodiment of the invention may be used in manufactures of devices other than the organic EL elements 112. FIG. 16A is a schematic plan view of a color filter substrate and FIG. 16B is a schematic sectional view of the color filter substrate. As shown in FIGS. 16A and 168, the color filter substrate 200 includes a transparent substrate 201 made of, for example, glass, a partition member 202 disposed on the substrate 201, and colored layers 203R, 203G and 203B that are formed corresponding to red (R), green (G) and blue (B) in deposition regions separated from one another by a partition member 202. A function layer ink according to an embodiment of the invention can be used in a process for manufacturing such a color filter substrate in which function layer inks each containing a colored layer material are applied by a liquid ejection method, Thus, the color filter substrate 200 is provided with colored layers 203R, 203G and 203B having a desired thickness and a desired shape.

The entire disclosure of Japanese Patent Application No. 2012-083623, filed Apr. 2, 2012 is expressly incorporated by reference herein.

What is claimed is:

1. A function layer ink used for forming a function layer by a liquid coating method, the function layer ink comprising:
   a function layer material containing a macromolecular or low-molecular-weight material; and
   a mixed solvent containing 0.1% by weight or more of solvent A having a viscosity in the range of 0.01 to 0.05 Pa·s at 25° C. and 1 atm, and solvent B having a viscosity of less than 0.01 Pa·s at 25° C. and 1 atm, and a lower boiling point than the solvent A, the solvent B having a higher boiling point than 200° C., the mixed solvent having a viscosity of less than 0.02 Pa·s at 25° C. and 1 atm and a boiling point in the range of 200 to 350° C.

2. The function layer ink according to claim 1, wherein the solvent A and the solvent B are non-aqueous solvents.

3. The function layer ink according to claim 1, wherein the solvent A and the solvent B are aqueous solvents.

4. The function layer ink according to claim 1, wherein the solvent A is a non-aqueous solvent and the solvent B is an aqueous solvent.

5. The function layer ink according to claim 1, wherein the solvent A is an aqueous solvent and the solvent B is a non-aqueous solvent.

6. A method for manufacturing a light-emitting element having a function layer including one or more organic layers including an organic luminescent layer, the method comprising:
   forming at least one of the organic layers using the function layer ink as set forth in claim 1.

7. The method according to claim 6, wherein the function layer includes a hole injection layer, a hole transport layer, and the organic luminescent layer, and the hole injection layer is formed using the function layer ink.

8. The method according to claim 6, wherein the function layer includes a hole injection layer, a hole transport layer, and the organic luminescent layer, and the hole transport layer is formed using the function layer ink.

9. The method according to claim 6, wherein the function layer includes a hole injection layer, a hole transport layer, and the organic luminescent layer, and the organic luminescent layer is formed using the function layer ink.

10. A light-emitting device comprising:
    a light-emitting element produced by the method as set forth in claim 6.

11. An electronic apparatus comprising a light-emitting device as set forth in claim 10.

12. The function layer ink according to claim 1, including, the solvent A having a higher boiling point than 200° C.

13. The function layer ink according to claim 1, including, the solvent B being selected from a first solvent group consisting of 3-Phenoxy-Toluene, 3-Isopropyl-Biphenyl, Dimethyl-Naphthalene, 1,2,3,4-Tetramethyl-Benzene, Diethylene-Glycol-Butylmethyl-Ether, Diethylene-Glycol-Dibutyl-Ether, Diethylene-Glycol-Monobutyl-Ether Acetate, Diethylene-Glycol-Monoethyl-Ether, Diethylene-Glycol-Monoisopropyl-Ether, Diethylene-Glycol-Monoisobutyl-Ether, Tripropylene-Glycol-Monoethyl-Ether, tetraethylene-Glycol-Dimethyl-Ether.

14. The function layer ink according to claim 13, including,
the first solvent group further including Triethylene-Glycol-Monomethyl-Ether, Triethylene-Glycol-Monobutyl-Ether, Triethylene-Glycol-Diethyl-Ether, Triethylene-Glycol-butylmethyl-Ether.

15. The function layer ink according to claim 1, including, the solvent A being selected from a solvent group consisting of 1,1-bis(3,4-Dimethylphenyl)-Ethane, Ethylene-Glycol-Monophenyl-Ether, Tetra ethylene-Glycol-Monobutyl-Ether.

16. The function layer ink according to claim 1, including,
the mixed solvent including a solvent selected from a group consisting of, γ-butyrolactone, hexamethylphosphoramide, 1,3-dimethyl-2-imidazolidinone, derivatives of 1,3-dimethyl-2-imidazolidinone, Carbitol acetate, and butyl Carbitol acetate.

17. A function layer ink used for forming a function layer by a liquid coating method, the function layer ink comprising:
a function layer material containing a macromolecular or low-molecular-weight material; and
a mixed solvent containing 0.1% by weight or more of solvent A having a viscosity in the range of 0.01 to 0.05 Pa·s at 25° C. and 1 atm, and solvent B having a viscosity of less than 0.01 Pa·s at 25° C. and 1 atm, and a lower boiling point than the solvent A, the mixed solvent having a viscosity of less than 0.02 Pa·s at 25° C. and 1 atm and a boiling point in the range of 200 to 350° C., the mixed solvent including a solvent selected from a group consisting of, γ-butyrolactone, hexamethylphosphoramide, 1,3-dimethyl-2-imidazolidinone, derivatives of 1,3-dimethyl-2-imidazolidinone, Carbitol acetate, and butyl Carbitol acetate.

* * * * *